(12) United States Patent
Araki et al.

(10) Patent No.: US 9,788,420 B2
(45) Date of Patent: Oct. 10, 2017

(54) SUBSTRATE AND TOUCH PANEL MEMBER USING SAME

(71) Applicant: TORAY INDUSTRIES, INC., Tokyo (JP)

(72) Inventors: Hitoshi Araki, Otsu (JP); Mitsuhito Suwa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 14/762,875

(22) PCT Filed: Jan. 16, 2014

(86) PCT No.: PCT/JP2014/050682
§ 371 (c)(1),
(2) Date: Jul. 23, 2015

(87) PCT Pub. No.: WO2014/119371
PCT Pub. Date: Aug. 7, 2014

(65) Prior Publication Data
US 2015/0366055 A1 Dec. 17, 2015

(30) Foreign Application Priority Data

Jan. 29, 2013 (JP) ................................. 2013-013868

(51) Int. Cl.
*H05K 1/00* (2006.01)
*H05K 1/03* (2006.01)
*G06F 3/041* (2006.01)

(52) U.S. Cl.
CPC ........... *H05K 1/0353* (2013.01); *G06F 3/041* (2013.01)

(58) Field of Classification Search
None
See application file for complete search history.

(56) References Cited

U.S. PATENT DOCUMENTS

| 4,904,059 A | 2/1990 | Torigoe |
| 2004/0209056 A1 | 10/2004 | Oguri |

(Continued)

FOREIGN PATENT DOCUMENTS

| JP | 01205122 | 8/1989 |
| JP | 6033000 | 2/1994 |

(Continued)

OTHER PUBLICATIONS

Takeda et al. (WO2006007071) Abstract.*
(Continued)

*Primary Examiner* — Steven T Sawyer
(74) *Attorney, Agent, or Firm* — RatnerPrestia

(57) ABSTRACT

The present invention aims to provide a substrate having an ITO with a low ITO pattern visibility, which substrate is formed by a method utilizing a simple technique such as coating, printing or the like, and which method is less burdensome from the viewpoints of cost and process; and to provide a touch panel member using the substrate. The present invention provides a substrate including a region where thin layers are laminated on a transparent ground substrate, which thin layers are, in the order mentioned from the upper surface of the substrate: an ITO (Indium Tin Oxide) thin layer (I); an organic thin layer (II) having a film thickness of from 0.01 to 0.4 μm and a refractive index of from 1.58 to 1.85; and a transparent adhesive thin layer (III) having a refractive index of from 1.46 to 1.52.

6 Claims, 2 Drawing Sheets

(56) References Cited

U.S. PATENT DOCUMENTS

| | | |
|---|---|---|
| 2005/0024339 A1 | 2/2005 | Yamazaki |
| 2005/0271832 A1 | 12/2005 | Goto |
| 2007/0146598 A1* | 6/2007 | Yokokawa ............ G02F 1/1337 349/123 |
| 2007/0224412 A1* | 9/2007 | Hara ...................... B32B 17/06 428/336 |
| 2008/0239488 A1* | 10/2008 | Asakura ................. G02B 1/111 359/485.01 |
| 2008/0291374 A1 | 11/2008 | Wang |
| 2009/0002323 A1* | 1/2009 | Shiroishi ................ G06F 3/044 345/173 |
| 2009/0207116 A1 | 8/2009 | Rho |
| 2010/0215931 A1* | 8/2010 | Chu .................... C03C 17/3417 428/216 |
| 2011/0212305 A1* | 9/2011 | Chen ...................... G02B 1/116 428/172 |
| 2012/0043691 A1 | 2/2012 | Uekido |
| 2012/0114919 A1* | 5/2012 | Nakajima ............... G06F 3/044 428/203 |
| 2013/0020117 A1* | 1/2013 | Yamato ................... C08J 7/047 174/258 |
| 2013/0087372 A1* | 4/2013 | Nashiki .................. G06F 3/041 174/257 |
| 2013/0194211 A1 | 8/2013 | Shinohara |
| 2013/0194221 A1 | 8/2013 | Takada |
| 2014/0098035 A1 | 4/2014 | Huang |
| 2015/0125680 A1 | 5/2015 | Araki |

FOREIGN PATENT DOCUMENTS

| | | |
|---|---|---|
| JP | 08240800 | 9/1996 |
| JP | 2007065232 | 3/2007 |
| JP | 2009301767 | 12/2009 |
| JP | 2010086684 | 4/2010 |
| JP | 2010152809 | 7/2010 |
| JP | 2011016264 | 1/2011 |
| JP | 2011194679 | 10/2011 |
| JP | 2012081663 | 4/2012 |
| WO | 2013175958 | 11/2013 |

OTHER PUBLICATIONS

International Search Report for International Application No. PCT/JP2014/050682 mailed Apr. 1, 2014.

International Search Report for International Application No. PCT/JP2014/050683 mailed Apr. 1, 2014.

Non Final Office Action for U.S. Appl. No. 14/762,981, dated Nov. 18, 2016, 17 pages.

\* cited by examiner

SUBSTRATE AND TOUCH PANEL MEMBER USING SAME

CROSS REFERENCE TO RELATED APPLICATIONS

This is the U.S. National Phase application of PCT International Application No. PCT/JP2014/050682, filed Jan. 16, 2014, and claims priority to Japanese Patent Application No. 2013-013868, filed Jan. 29, 2013, the disclosures of each of these applications being incorporated herein by reference in their entireties for all purposes.

FIELD OF THE INVENTION

The present invention relates to a substrate and a touch panel member using the same.

BACKGROUND OF THE INVENTION

With recent diffusion of smartphones and tablet terminals, touch panels are drawing attention. One of the problems of the touch panels is the deterioration of the appearance of terminals due to the visibility of indium tin oxide (hereinafter, referred to as "ITO") pattern used in the sensor formation, that is, the problem of the ITO pattern visibility. Further, with a growing demand for a lighter weight and thinner terminals in recent years, a type of touch panel has been proposed, for example, in which the number of glasses used is reduced by forming a sensor on the back surface side of the cover glass (Patent Document 1). However, in this type of touch panel, referred to as a cover glass integrated type, the distance from the outermost surface of the terminal to the ITO pattern becomes shorter, compared to that of a conventional sensor glass/cover glass separated type, making the problem of the ITO pattern visibility more pronounced.

As the representative technique to reduce the ITO pattern visibility in liquid crystal display devices, a technique has been developed in which an insulating thin layer is formed on the upper part or the lower part of an ITO layer to reduce the interface reflection (Patent Documents 2 to 4). In addition, as the technique to reduce the ITO pattern visibility in touch panels, a technique has been developed in which a thin layer composed of $Nb_2O_3$ and $SiO_2$ is disposed as an undercoat layer or a topcoat layer (Patent Documents 5 and 6).

PATENT DOCUMENTS

Patent Document 1: JP 2009-301767 A
Patent Document 2: JP 1-205122 A
Patent Document 3: JP 6-033000 A
Patent Document 4: JP 8-240800 A
Patent Document 5: JP 2010-152809 A
Patent Document 6: JP 2010-086684 A

SUMMARY OF THE INVENTION

However, it is impossible or difficult to utilize the techniques for conventional liquid crystal display devices in touch panels, because of the structural limitations of touch panels. Further, while the techniques for conventional touch panels are certainly capable of reducing the ITO pattern visibility, they are associated with a large burden in terms of cost, because a plurality of layers must be formed by vacuum processing.

Accordingly, an object of the present invention is to provide a substrate which serves to reduce the burden on the production cost or the production process, while reducing the ITO pattern visibility in touch panels.

The present inventors have found, as a result of extensive studies, that a substrate comprising a region where thin layers are laminated on a transparent ground substrate, which thin layers are, in the order mentioned from the upper surface of the substrate: an ITO thin layer (I); an organic thin layer (II) having a film thickness of from 0.01 to 0.4 μm and a refractive index of from 1.58 to 1.85; and a transparent adhesive thin layer (III) having a refractive index of from 1.46 to 1.52; is capable of significantly improving the problem of the ITO pattern visibility in touch panels.

In other words, the present invention includes the following constitutions.

[1] A substrate comprising a region where thin layers are laminated on a transparent ground substrate, which thin layers are, in the order mentioned from the upper surface of the substrate,
an ITO thin layer (I);
an organic thin layer (II) having a film thickness of from 0.01 to 0.4 μm and a refractive index of from 1.58 to 1.85; and
a transparent adhesive thin layer (III) having a refractive index of from 1.46 to 1.52.

[2] The substrate according to item [1], wherein the organic thin layer (II) contains metal oxide particles.

[3] The substrate according to item [1] or [2], wherein the organic thin layer (II) contains a resin selected from the group consisting of polyimides, cardo type resins, acrylic resins, polysiloxanes, polybenzoxazoles, phenol resins, polyamideimides, polyethersulfones, polyurethanes and polyesters.

[4] The substrate according to any one of items [1] to [3], wherein the organic thin layer (II) contains a resin selected from the group consisting of polyimides, cardo type resins, polysiloxanes, polybenzoxazoles, phenol resins, polyamideimides, polyethersulfones, polyurethanes and polyesters.

[5] The substrate according to any one of items [1] to [4], wherein the organic thin layer (II) contains a resin containing a carboxyl group and/or a phenolic hydroxyl group.

[6] The substrate according to any one of items [1] to [5], wherein the organic thin layer (II) is formed using a resin composition containing a precursor selected from the group consisting of polyimide precursors, polyamideimide precursors and polybenzoxazole precursors.

[7] The substrate according to any one of items [1] to [6], wherein the transparent ground substrate is a tempered glass substrate.

[8] A touch panel member using the substrate according to any one of items [1] to [7].

The substrate of the present invention serves to significantly reduce the ITO pattern visibility in a touch panel. Further, the substrate of the present invention can be produced by a method which is less burdensome from the viewpoint of cost or process.

DETAILED DESCRIPTION OF EMBODIMENTS OF THE INVENTION

The substrate of an embodiment of the present invention includes a region where thin layers are laminated on a transparent ground substrate, which thin layers are, in the order mentioned from the upper surface of the substrate: an ITO thin layer (I); an organic thin layer (II) having a film thickness of from 0.01 to 0.4 μm and a refractive index of from 1.58 to 1.85; and a transparent adhesive thin layer (III) having a refractive index of from 1.46 to 1.52.

The combination of organic thin layer (II) and transparent adhesive thin layer (III) having different refractive indices allows to reduce the reflected light at the upper interface and the lower interface of ITO thin layer (I) formed below the organic thin layers (II) and transparent adhesive thin layer (III), thereby reducing the ITO pattern visibility.

The organic thin layer as used herein refers to a thin layer containing one or more organic components.

In the present specification, any description of the range described by the expression "(from) . . . to . . . " means that it includes the numeric values on both sides of the range.

By forming an organic thin layer (II) having a film thickness of from 0.01 to 0.4 μm and a refractive index of from 1.58 to 1.85, and by disposing on the upper surface thereof a transparent adhesive thin layer (III) having a refractive index of from 1.46 to 1.52, the phase and the intensity of the reflected light at the upper interface and the lower interface of organic thin layer (II) can be controlled, and the reflected light at the upper interface and the lower interface of ITO thin layer (I) can be reduced as described above, thereby reducing the ITO pattern visibility. If the film thickness of organic thin layer (II) is less than 0.01 μm or greater than 0.4 μm, the control of the phase becomes difficult, making the effect of reducing the pattern visibility less likely to be obtained. If the refractive index of organic thin layer (II) is less than 1.58 or greater than 1.85, the intensity of the reflected light cannot be controlled, making the effect of reducing the pattern visibility less likely to be obtained. If the refractive index of transparent adhesive thin layer (III) is lower than 1.46 or greater than 1.52, the control of the phase becomes difficult, making the effect of reducing the pattern visibility less likely to be obtained.

The "refractive index" as used herein refers to the refractive index of light having a wavelength of 633 nm. The refractive index of the thin layer can be measured using a prism coupler, when the film thickness thereof is 1 μm or more, or by ellipsometry, when the film thickness is less than 1 μm.

Figure 2:
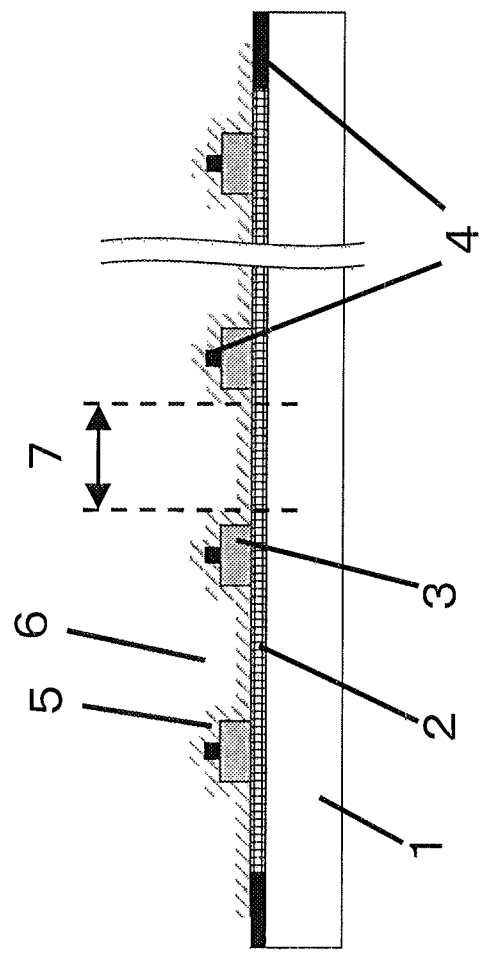
FIG. 2 is a schematic view showing the cross section of the substrate of an embodiment of the present invention.

Further, the film thickness as used herein refers to the film thickness measured in a sufficiently large area of the substrate onto which an ITO thin layer (I), an organic thin layer (II), and a transparent adhesive thin layer (III) are laminated (for example, the area designated by reference numeral 7 in FIG. 2). The film thickness can be measured using a stylus type step profiler.

The material of the transparent ground substrate which constitutes the base of the substrate of the present invention is not particularly limited, as long as it is capable of transmitting light. However, those having a total light transmittance (in accordance with JIS K7361-1) of 80% or more per 0.1 mm thickness are preferred. Examples thereof include glasses, acrylic resins, polyester resins, polycarbonates, polyarylates, polyethersulfones, polypropylenes, polyethylenes, polyimides and cycloolefin polymers. Among these, glasses, acrylic resins, polyester resins, polycarbonates or cycloolefin polymers are preferred from the viewpoint of transparency, and glasses are more preferred from the viewpoint of heat resistance and chemical resistance. Examples of the glass include alkali glasses, non-alkali glasses, heat tempered glasses and chemically tempered glasses. Preferred is a tempered glass, such as a heat tempered glass or a chemically tempered glass, which is widely used as a cover glass in a touch panel. The tempered glass refers to a glass on the surface of which a compressive stress layer is formed. In general, the compressive stress of the compressive stress layer is from 400 to 2000 MPa, and the thickness of the compressive stress layer is from 10 to 70 μm.

The acrylic resin is preferably methyl polymethacrylate.

The polyester resin is preferably polyethylene terephthalate, polyethylene naphthalate or polybutylene terephthalate.

The polycarbonate is preferably a resin obtained by polycondensation of bisphenol A and phosgene.

The polyimide is preferably a resin composed of an aliphatic carboxylic dianhydride and/or an aliphatic diamine as monomer(s), from the viewpoint of transparency.

The cycloolefin polymer is preferably one obtained by addition polymerization or ring-opening metathesis polymerization of cyclohexene or norbornene or a derivative thereof, for example.

The transparent ground substrate according to an embodiment of the present invention includes on the upper surface thereof an ITO thin layer (I). The ITO thin layer is used as a transparent conductive layer in a touch panel. As the method for forming the ITO thin layer, a sputtering method is preferred, because a thin layer having a low resistance can be easily obtained and the film thickness thereof can be precisely controlled. ITO thin layer (I) preferably has a film thickness of from 1 to 200 nm.

On the upper surface of ITO thin layer (I), an organic thin layer (II) and a transparent adhesive thin layer (Ill) are further laminated.

Organic thin layer (II) is preferably formed as a composite of a resin having a refractive index of from 1.58 to 1.85, another resin(s), and metal oxide particles. Organic thin layer (II) is preferably prepared by a method in which a resin composition is prepared, and then a thin layer is formed using the resin composition by a coating or printing technique, since it is less burdensome from the viewpoint of the cost and the process. Examples of the apparatus used for the coating of the prepared resin composition include apparatuses for coating the entire surface of the substrate utilizing methods such as spin coating, dip coating, curtain flow coating, spray coating, and slit coating; and printing apparatuses utilizing methods such as screen printing, roll coating, micro gravure coating and ink jet printing.

Examples of the resin used for the formation of organic thin layer (II) include polyimides, cardo type resins, acrylic resins, polysiloxanes, polybenzoxazoles, melamine resins, phenol resins, polyamideimides, polyethersulfones, polyurethanes and polyesters. Of these, a polyimide, a cardo type resin, a polybenzoxazole, a polyamideimide, a polyethersulfone or a polyurethane is preferred, because the refractive index of the thin layer can be easily controlled to the range of from 1.58 to 1.85, even in cases where the thin layer is formed solely from a resin component. More preferred is a polyimide, a polybenzoxazole or a polyamideimide, because of its high adhesion to ITO. Further, an acrylic resin or a polysiloxane is preferred from the viewpoint of transmittance. A resin containing an alkali-soluble group such as a carboxyl group and/or phenolic hydroxyl group is also preferred. By containing an alkali-soluble group, the resin can be used as the base resin of a photosensitive resin composition, and the patterning thereof can be performed easily.

In view of the above, organic thin layer (II) preferably contains a resin selected from the group consisting of polyimides, cardo type resins, acrylic resins, polysiloxanes, polybenzoxazoles, phenol resins, polyamideimides, polyethersulfones, polyurethanes and polyesters.

Further, organic thin layer (II) preferably contains a resin containing a carboxyl group and/or a phenolic hydroxyl group.

In addition, from the viewpoint of heat resistance, the above mentioned organic thin layer (II) preferably contains a resin selected from the group consisting of polyimides, cardo type resins, polysiloxanes, polybenzoxazoles, phenol resins, polyamideimides, polyethersulfones and polyesters. If the heat resistance of organic thin layer (II) is improved, degradation of the layer is less likely to occur during the heating step, pressurization step and vacuuming step, which are carried out when forming transparent adhesive thin layer (III), thereby reducing the occurrence of defects such as bubbles or poor adhesion.

In cases where a polyimide is used in the formation of organic thin layer (II), it is preferred that a polyimide thin layer be formed by applying a polyimide precursor on a transparent ground substrate having ITO thin layer (I), followed by cyclodehydration reaction, from the viewpoint of the storage stability of the coating solution, the solubility of the resin, and the ease of introduction of (an) alkali-soluble group(s). Examples of the polyimide precursor herein include polyamic acids, polyamic acid esters, polyamic acid amides and polyisoimides. The polyamic acid containing a tetra carboxylic residue and a diamine residue can be obtained by reacting a tetracarboxylic acid or a corresponding tetracarboxylic dianhydride or a tetracarboxylic acid diester dichloride, with a diamine or a corresponding diisocyanate compound or a trimethylsilylated diamine. The polyimide can be obtained by cyclodehydration of a polyamic acid via heat treatment or chemical treatment with an acid, base or the like. More specifically, the heat treatment may be carried out with a solvent which forms an azeotrope with water such as m-xylene, or with a weakly acidic carboxylic acid compound at a low temperature of 100° C. or lower. Examples of cyclization catalysts used in the above mentioned chemical treatment include dehydration condensation agents such as carboxylic anhydrides and dicyclohexylcarbodiimide; and bases such as triethylamine.

In cases where a polybenzoxazole is used in the formation of organic thin layer (II), it is preferred that a polybenzoxazole thin layer be formed by applying a polybenzoxazole precursor on a transparent ground substrate having ITO thin layer (I), followed by cyclodehydration reaction, from the viewpoint of the storage stability of the coating solution, the solubility of the resin, and the ease of introduction of an alkali-soluble group(s). Examples of the polybenzoxazole precursor include polyhydroxyamides, polyaminoamides, polyamides and polyamideimides. Of these, a polyhydroxyamide is preferred. The polyhydroxyamide containing a dicarboxylic acid residue and a bisaminophenol residue can be obtained by reacting a bisaminophenol with a dicarboxylic acid, a corresponding dicarboxylic acid chloride, a dicarboxylic acid active ester or the like. The polybenzoxazole can be obtained by cyclodehydration of a polyhydroxyamide via heat treatment or chemical treatment. More specifically, the heat treatment may be performed with a solvent which forms an azeotrope with water such as m-xylene and the like, or with an acidic carboxylic acid compound at a low temperature of 200° C. or lower. Examples of the cyclization catalyst used in the above mentioned chemical treatment include phosphoric anhydrides, bases, and carbodiimide compounds.

In cases where a polyamideimide is used in the formation of organic thin layer (II), it is preferred that a polyamideimide thin layer be formed by applying a polyamideimide precursor on a transparent ground substrate having ITO thin layer (I), followed by cyclodehydration reaction, from the viewpoint of the storage stability of the coating solution, the solubility of the resin, and the ease of introduction of an alkali-soluble group(s). The polyamideimide precursor containing a tricarboxylic acid residue and a diamine residue can be obtained by polymerization of a tricarboxylic acid or a derivative thereof, and diamine or a corresponding diisocyanate compound. The polyamideimide can be obtained in the same manner as obtaining a polyimide from a polyimide precursor.

Therefore, in the present invention, organic thin layer (II) is preferably formed using a resin composition containing a precursor selected from the group consisting of polyimide precursors, polyamideimide precursors and polybenzoxazole precursors. If organic thin layer (II) is formed using a resin composition containing a precursor selected from the group consisting of polyimide precursors, polyamideimide precursors and polybenzoxazole precursors, it is possible to effectively incorporate a resin selected from the group consisting of polyimides, cardo type resins, acrylic resins, polysiloxanes, polybenzoxazoles, phenol resins, polyamideimides, polyethersulfones and polyesters, into organic thin layer (II).

The polyimide, polyimide precursor, polybenzoxazole, polybenzoxazole precursor, polyamideimide or polyamideimide precursor used in the formation of organic thin layer (II) preferably contains a structural unit represented by one or more formulae selected from the following General Formulae (1) to (4). Further, the film may contain two or more types of resins having these structural units, or the resin may be one obtained by copolymerization of two or more types of these structural units. The polyimide, polyimide precursor, polybenzoxazole, polybenzoxazole precursor, polyamideimide or polyamideimide precursor used in the formation of organic thin layer (II) preferably contains a structural unit represented by one or more formulae selected from the following General Formulae (1) to (4), in an amount of 50 mol % or more relative to the total structural units in the resin, more preferably, 70 mol % or more, and still more preferably, 90 mol % or more.

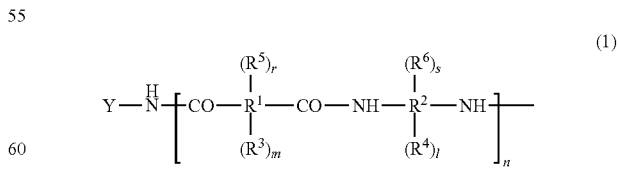

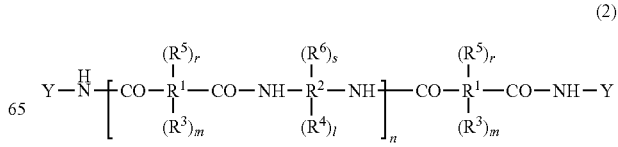

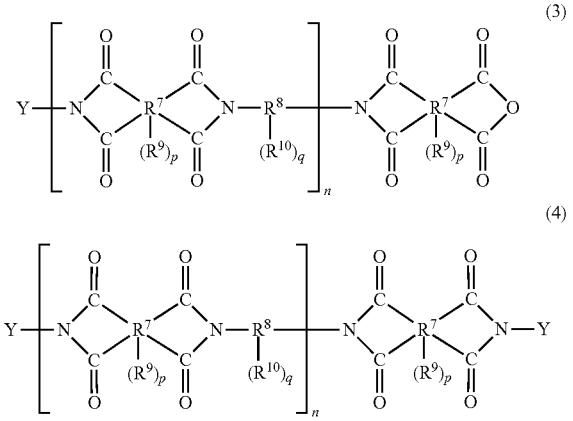

In General Formulae (1) to (4), each of a plurality of $R^1$, $R^2$ and $R^8$ may be the same or different, and represents a 2- to 8-valent organic group having two or more carbon atoms. Each of a plurality of $R^7$ represents a 4- to 8-valent organic group having two or more carbon atoms. Each of a plurality of $R^3$ and $R^4$ may be the same or different, and represents a phenolic hydroxyl group or a carboxyl group or an alkylated group thereof. Each of a plurality of $R^5$, $R^6$, $R^9$ and $R^{10}$ may be the same or different, and represents a group selected from a hydrogen atom, a phenolic hydroxyl group, a sulfonic acid group, a thiol group and a monovalent organic group having from 1 to 20 carbon atoms. Y represents a terminal group. n is within a range of from 10 to 10,000; r, s and q each represents an integer of from 0 to 6; and p, m and l each represents an integer of from 0 to 4.

In General Formulae (1) to (4), $R^1(R^3)_m(R^5)_r(CO)_2$ represents a di-, tri-, or tetra-carboxylic residue; and $R^7(R^9)_p(CO)_4$ represents a tetra carboxylic residue (hereinafter, collectively referred to as "acid residue").

By using an acid component corresponding to these acid residues, when the polymerization is carried out, an acid residue can be incorporated into the structural units. For example, if an acid component such as $R^1(R^3)_m(R^5)_r(COOH)_2$ or $R^7(R^9)_p(COOH)_4$ is used when the polymerization is carried out, an acid residue such as $R^1(R^3)_m(R^5)_r(CO)_2$ or $R^7(R^9)_p(CO)_4$ can be incorporated into the structural unit.

Examples of the acid component constituting $R^1(R^3)_m(R^5)_r(COOH)_2$ and $R^7(R^9)_p(COOH)_4$ include dicarboxylic acids such as terephthalic acid, isophthalic acid, diphenyl ether dicarboxylic acid, bis(carboxyphenyl)hexafluoropropane, biphenyldicarboxylic acid, benzophenonedicarboxylic acid and triphenyldicarboxylic acid; tricarboxylic acids such as trimellitic acid, trimesic acid, diphenyl ether tricarboxylic acid and biphenyltricarboxylic acid; aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid and 3,4,9,10-perylenetetracarboxylic acid; and aliphatic tetracarboxylic acids such as butanetetracarboxylic acid, cyclobutanetetracarboxylic acid, 1,2,3,4-cyclopentanetetracarboxylic acid, cyclohexanetetracarboxylic acid, bicyclo[2.2.1.]heptantetracarboxylic acid, bicyclo[3.3.1.]tetracarboxylic acid, bicyclo[3.1.1.]hept-2-ene tetracarboxylic acid, bicyclo[2.2.2.]octanetetracarboxylic acid and adamantanetetracarboxylic acid; and the like. Further, examples of the suitable structure of the acid residue include the following structures, or structures in which 1 to 4 hydrogen atoms in each of these structures are substituted with a $C_1$-$C_{20}$ alkyl group(s), a fluoroalkyl group(s), an alkoxyl group(s), an ester group(s), a nitro group(s), a cyano group(s), a fluorine atom(s) or a chlorine atom(s).

These acids can be used as they are or as acid anhydrides, acid chlorides or active esters.

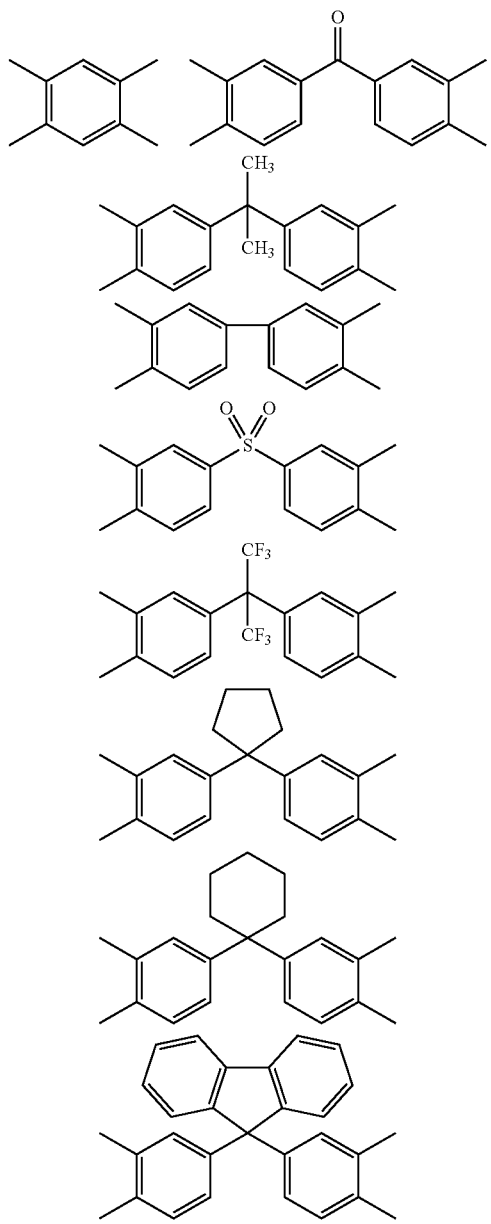

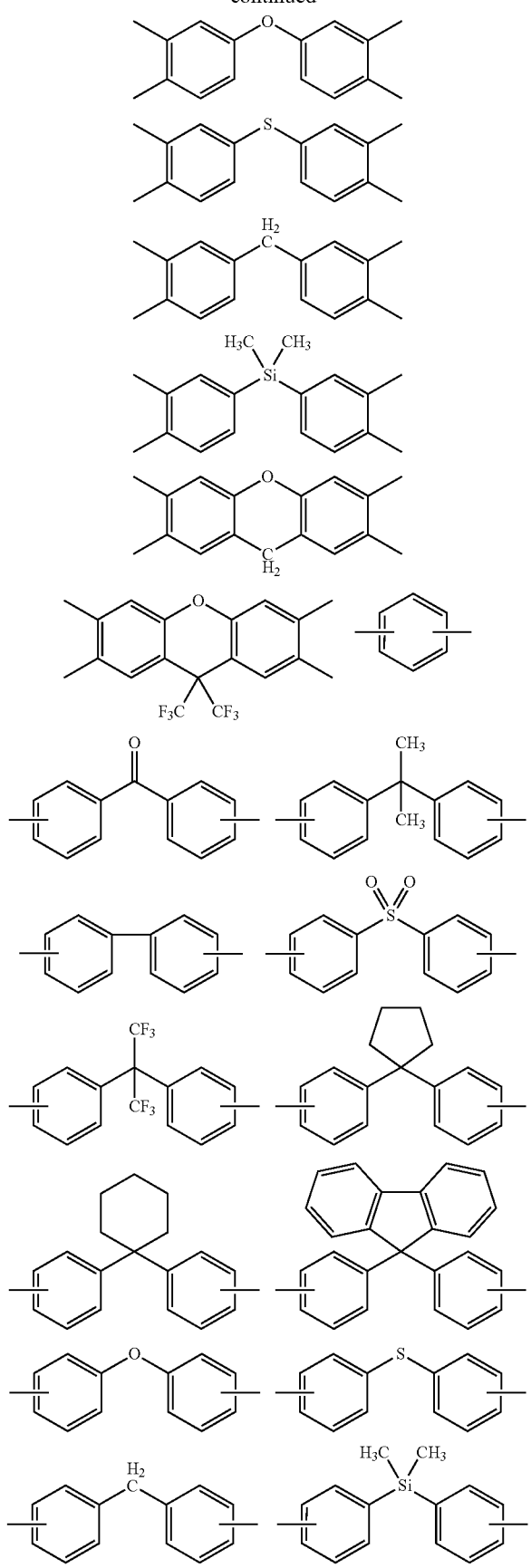

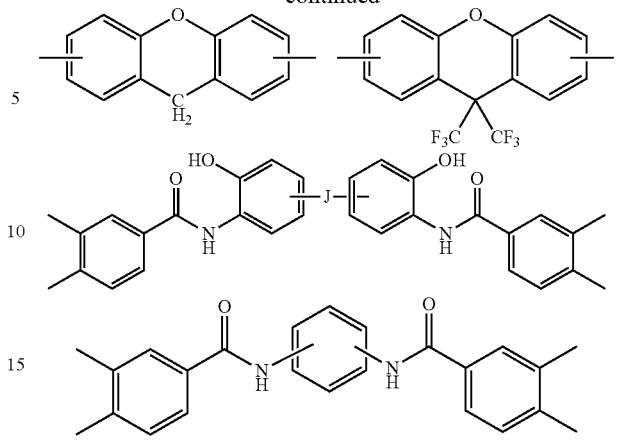

wherein J represents a direct bond, —COO—, —CONH—, —CH$_2$—, —C$_2$H$_4$—, —O—, —C$_3$H$_6$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$— or —C$_6$H$_4$—C$_3$F$_6$—C$_6$H$_4$—.

Further, use of a silicon atom-containing tetracarboxylic acid such as dimethylsilanediphthalic acid or 1,3-bis(phthalic acid)tetramethyldisiloxane serves to improve the adhesion to the transparent ground substrate and the resistance to oxygen plasma and UV ozone treatment used for the cleaning and the like. These silicon atom-containing dicarboxylic acids or tetracarboxylic acids are preferably used in an amount of from 1 to 30 mol % relative to the total acid components.

In General Formulae (1) to (4), $R^2(R^4)_1(R^6)_s(N—)_2$ and $R^8(R^{10})_q(N—)_2$ each represents a diamine residue or a bisaminophenol residue (hereinafter, collectively referred to as "amine residue").

By using a diamine component or a bisaminophenol component corresponding to these amine residues, when the polymerization is carried out, an amine residue can be incorporated into the structural units. For example, if a diamine component or a bisaminophenol component such as $R^2(R^4)_1(R^6)_s(NH_2)_2$ or $R^8(R^{10})_q(NH_2)_2$ is used when the polymerization is carried out, an amine residue such as $R^2(R^4)_1(R^6)_s(N—)_2$ or $R^8(R^{10})_q(N—)_2$ can be incorporated into the structural units.

Examples of the diamine component and the bisaminophenol component (hereinafter, collectively referred to as "diamine component") constituting $R^2(R^4)_1(R^6)_s(NH_2)_2$ and $R^8(R^{10})_q(NH_2)_2$ include: hydroxyl group-containing diamines such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl and bis(3-amino-4-hydroxyphenyl)fluorene; carboxyl group-containing diamines such as 3,5-diaminobenzoic acid and 3-carboxy-4,4'-diaminodiphenyl ether; sulfonic acid-containing diamines such as 3-sulfonic acid-4,4'-diaminodiphenyl ether; dithiohydroxyphenylenediamine, 3,4'-diaminodiphenyl ether, 4,4'-diaminodiphenyl ether, 3,4'-diaminodiphenylmethane, 4,4'-diaminodiphenylmethane, 3,4'-diaminodiphenylsulphone, 4,4'-diaminodiphenylsulphone, 3,4'-diaminodiphenyl sulfide, 4,4'-diaminodiphenyl sulfide, 1,4-bis(4-aminophenoxy)benzine, benzine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxyl)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl and 2,2'-di(trifluoromethyl)-4,4'-diaminobiphenyl; and compounds in which one part of hydrogen atoms in each of the aromatic rings in these compounds is substituted with an alkyl group or an halogen atom; and aliphatic diamines such as cyclohexyldiamine and methylenebiscyclohexylamine. Further, each of these diamines may be substituted by one or more groups such as an alkyl group having from 1 to 10 carbon atoms such as a methyl group and an ethyl group; a fluoroalkyl group having from 1 to 10 carbon atoms such as a trifluoromethyl group; or F, Cl, Br, or I. In applications where heat resistance is required, aromatic diamines are preferably used in an amount of 50 mol % or more relative to the total diamine components. Further, examples of the suitable structure of the amine residue include the following structures, or structures in which 1 to 4 hydrogen atoms in each of these structures are substituted with a $C_1$-$C_{20}$ alkyl group(s), a fluoroalkyl group(s), an alkoxyl group(s), an ester group(s), a nitro group(s) or a cyano group(s), or a fluorine atom(s) or a chlorine atom(s).

These diamines may be used as they are or as corresponding diisocyanate compounds or trimethylsilylated diamines.

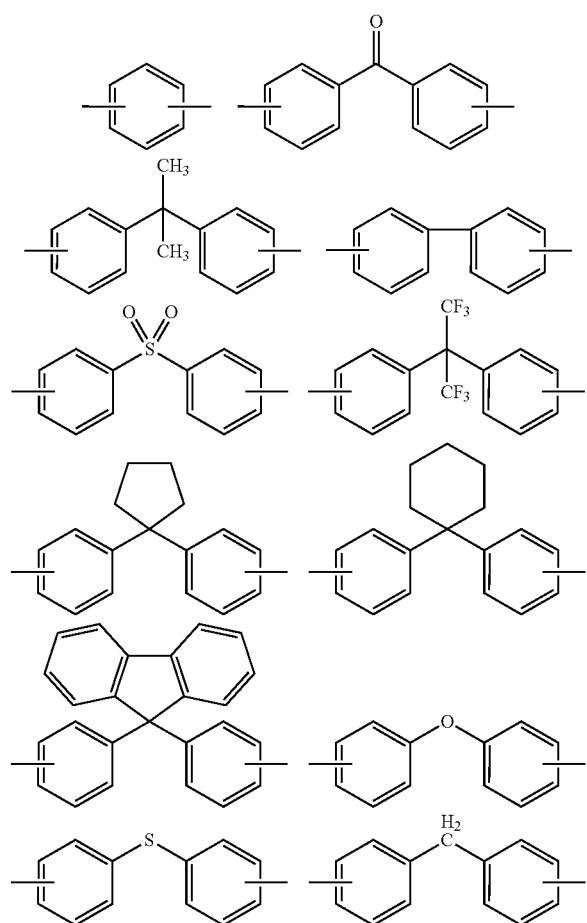

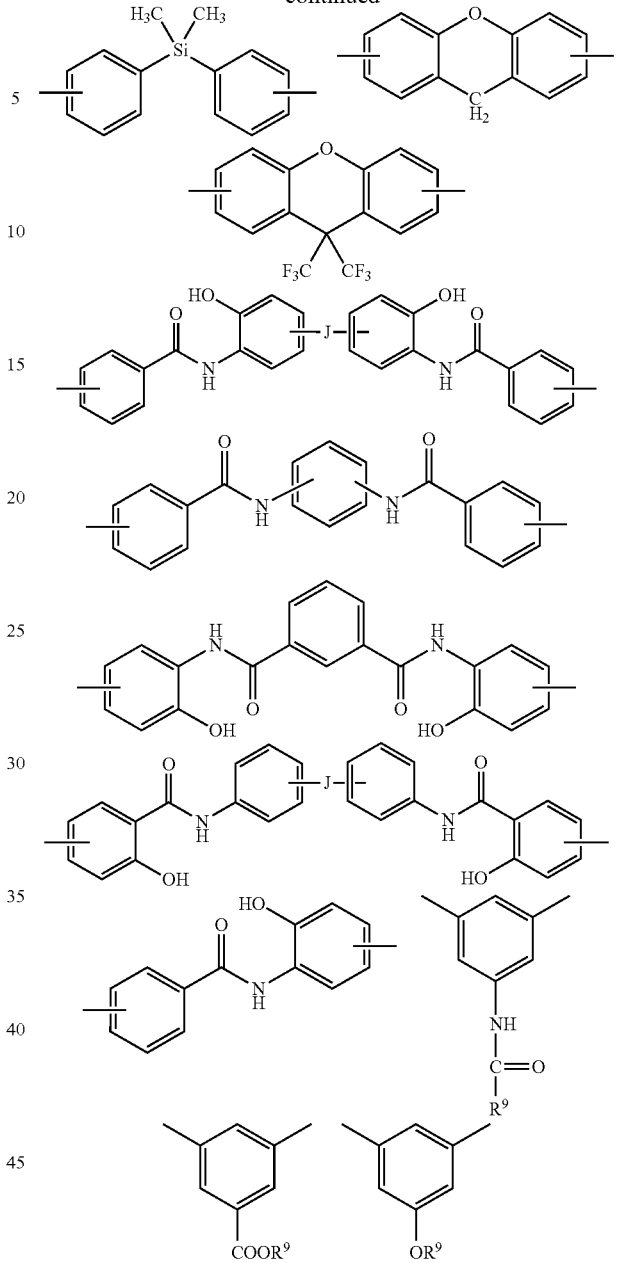

wherein J represents a direct bond, —COO—, —CONH—, —CH$_2$—, —C$_2$H$_4$—, —O—, —C$_3$H$_6$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$— or —C$_6$H$_4$—C$_3$F$_6$—C$_6$H$_4$—.

Further, use of a silicon atom-containing diamine such as 1,3-bis(3-aminopropyl)tetramethyldisiloxane or 1,3-bis(4-anilino)tetramethyldisiloxane as the diamine component serves to improve the adhesion to the transparent ground substrate and the resistance to oxygen plasma and UV ozone treatment used for the cleaning and the like. These silicon atom-containing diamines are preferably used in an amount of from 1 to 30 mol % relative to the total diamine components.

In order to improve the storage stability of the resin composition used in the formation of organic thin layer (II), it is preferred that the terminals of the main chain be blocked with a terminal blocking agent such as a monoamine, an acid anhydride, a monocarboxylic acid, a monoacid chloride compound or a mono-active ester compound. The introduction ratio of the monoamine used as the terminal blocking agent is preferably from 0.1 to 60 mol %, more preferably from 5 to 50 mol %, relative to the total amine components. The introduction ratio of the acid anhydride, monocarboxylic acid, monoacid chloride compound or mono-active ester compound used as the terminal blocking agent is preferably from 0.1 to 100 mol %, more preferably from 5 to 90 mol %, relative to the diamine components. A plurality of different terminal groups may be introduced by reacting a plurality of terminal blocking agents.

Preferred examples of the monoamine include aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol and 4-aminothiophenol. Two or more of these may be used in combination.

Preferred examples of the acid anhydride, monocarboxylic acid, monoacid chloride compound and mono-active ester compound include: acid anhydrides such as phthalic anhydride, maleic anhydride, nadic anhydride, cyclohexanedicarboxylic anhydride and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid and 4-carboxybenzenesulfonic acid; monoacid chloride compounds in which the carboxyl group in each of the above mentioned monocarboxylic acids is converted to an acid chloride; monoacid chloride compounds in which only one of the carboxyl groups in each of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene and 2,6-dicarboxynaphthalene is converted to an acid chloride; and active ester compounds obtained by reacting monoacid chloride compounds with N-hydroxybenzotriazole or N-hydroxy-5-norbornene-2,3-dicarboxyimide. Two or more of these may be used in combination.

The terminal blocking agent introduced into a resin can be easily detected, for example, by dissolving the resin into which the terminal blocking agent is introduced in an acid solution to separate the resin into amine components and acid components, which are constituent units of the resin, and then by measuring them by gas chromatography (GC) or NMR. Further, the terminal blocking agent can also be easily detected by measuring the resin into which the terminal blocking agent is introduced by pyrolysis gas chromatography (PGC), infrared spectrum or $^{13}$C NMR spectrum.

The weight average molecular weight (hereinafter, referred to as "Mw") of the polyimide, polyimide precursor, polybenzoxazole, polybenzoxazole precursor, polyamideimide or polyamideimide precursor used in the formation of organic thin layer (II) is preferably from 5,000 to 200,000 in terms of polystyrene as measured by gel permeation chromatography (hereinafter, referred to as "GPC"). If the Mw is within the above described range, good coating properties and a good solubility in a developer upon patterning can be obtained.

As the cardo type resin used in the formation of organic thin layer (II), a cured product of an epoxy compound or an acrylic compound having a cardo structure, or a polyester compound having a cardo structure is preferred. Examples of the epoxy compound having a cardo structure include 9,9-bis(4-glycidyloxyphenyl)fluorene and 9,9-bis[4-(2-glycidyloxyethoxy)phenyl]fluorene. Examples of the acrylic compound having a cardo structure include 9,9-bis[4-(2-acryloyloxyethoxyl)phenyl]fluorene, 9,9-bis[4-(2-methacryloyloxyethoxyl)phenyl]fluorene, 9,9-bis[4-(3-acryloyloxy-2-hydroxypropoxy)phenyl]fluorene and 9,9-bis[4-(2-(3-acryloyloxy-2-hydroxypropoxy)ethoxy)phenyl]fluorene.

Examples of the polyethersulfone used in the formation of organic thin layer (II) include "SUMIKAEXCEL PES 3600P", "SUMIKAEXCEL PES 4100P" and "SUMIKAEXCEL PES 4800P" (all of the above manufactured by Sumitomo Chemical Co., Ltd.).

The phenol resin used in the formation of organic thin layer (II) can be obtained by reacting a phenol compound with an aldehyde compound in the presence of an alkaline catalyst, followed by alkoxylation of methylol groups under acidic conditions in the usual manner. Preferred examples of the phenol compound include phenol, p-cresol, m-cresol, o-cresol, 2,3-dimethylphenol, 2,4-dimethylphenol, 2,5-dimethylphenol, 2,6-dimethylphenol, 3,4-dimethylphenol and 3,5-dimethylphenol. Examples of the aldehyde compound include formalin, paraformaldehyde, acetaldehyde, benzaldehyde, hydroxybenzaldehyde and chloroacetaldehyde. Two or more of these may be used in combination.

As the polyurethane used in the formation of organic thin layer (II), one obtained by reacting a multifunctional isocyanate with a polyol is preferred. Examples of the multifunctional isocyanate include hexamethylene diisocyanate, 1,3-bis(isocyanatemethyl)benzene, 1,3-bis(isocyanatemethyl)cyclohexane, norbornene diisocyanate, naphthalene-1,5-diisocyanate, diphenylmethane-4,4'-diisocyanate, and toluene-2,4-diisocyanate and the like. Examples of the polyol include ethylene glycol, propylene glycol, pentaerythritol, dipentaerythritol, 1,4-bis(2-hydroxyethoxy)benzene, 1,3-bis(2-hydroxyethoxy)benzene, 4,4'-bis(2-hydroxyethoxy)biphenyl, 2,2-bis(4-(2-hydroxyethoxyl)phenyl)propane, bis(4-(2-hydroxyethoxyl)phenyl)methane and the like. Two or more of these may be used in combination.

Examples of the melamine resin used in the formation of organic thin layer (II) include a resin obtained by reacting melamine and formaldehyde.

As the polyester used in the formation of organic thin layer (II), for example, one obtained by polyaddition reaction of a multifunctional epoxy compound and a polycarboxylic acid compound, or by polyaddition reaction of a polyol compound and a dianhydride is preferred, since it can be easily synthesized with less side reactions. As the polyol compound, one obtained by reacting a multifunctional epoxy compound with a radical polymerizable group-containing monobasic acid compound is preferred, because a radical polymerizable group(s) and an aromatic ring(s) can be easily introduced.

Examples of the method for allowing the polyaddition reaction of a multifunctional epoxy compound and a polycarboxylic acid compound to proceed include: a method in which 1.01 to 2 equivalents of the polycarboxylic acid compound relative to the multifunctional epoxy compound is added under the presence of a catalyst to allow the polymerization to proceed, followed by the addition of a radical polymerizable group-containing epoxy compound to the carboxylic acid site at the terminal, to add an acid anhydride to the hydroxyl group to be formed; and a method in which 1.01 to 2 equivalents of the multifunctional epoxy compound relative to the polycarboxylic acid compound is added under the presence of a catalyst to allow the polymerization to proceed, followed by the addition of a radical polymerizable group-containing monobasic acid compound to the epoxy site at the terminal, to add an acid anhydride to the hydroxyl group to be formed.

Examples of the method for allowing the polyaddition reaction of a polyol compound and a dianhydride to proceed include a method in which a polyol compound and a dianhydride are polymerized at an arbitrary ratio under the presence of a catalyst, followed by the addition of a radical polymerizable group-containing epoxy compound to one part of the carboxyl group to be formed. In cases where the polyol compound contains a radical polymerizable group, a radical polymerizable group-containing epoxy compound does not have to be added.

Examples of the catalyst used in the polyaddition reaction and addition reaction include: ammonium catalysts such as tetrabutylammonium acetate; amino catalysts such as 2,4,6-tris(dimethylaminomethyl)phenol and dimethylbenzylamine; phosphorus catalysts such as triphenylphosphine; and chromium catalysts such as chromium acetylacetonate and chromium chloride.

As the multifunctional epoxy compound, a compound represented by General Formula (5) below is preferred, in order to improve the control of the refractive index and the chemical resistance of the cured layer and the like.

(5)

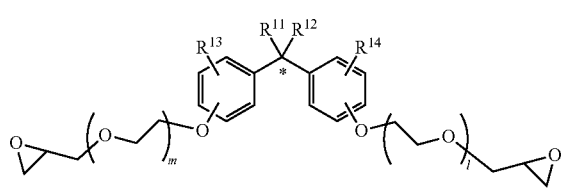

(wherein $R^{11}$ and $R^{12}$ each independently represents a hydrogen atom, an alkyl group or a cycloalkyl group having from 1 to 12 carbon atoms, an aryl group having from 6 to 20 carbon atoms or a substituted group thereof; or $R^{11}$ and $R^{12}$ together represent a cycloalkyl group having from 2 to 12 carbon atoms, an aromatic ring having from 5 to 12 carbon atoms or a substituted group thereof. $R^{13}$ and $R^{14}$ each independently represents a hydrogen atom, an alkyl group having from 2 to 12 carbon atoms, an aryl group having from 6 to 20 carbon atoms or a substituted group thereof. m and l each independently represents an integer of from 0 to 10.)

Examples of $R^{11}$, $R^{12}$, $R^{13}$ and $R^{14}$ include methyl, ethyl, propyl, cyclopentyl, cyclohexyl, phenyl, naphthyl, o-tolyl and biphenyl; and the following substituents.

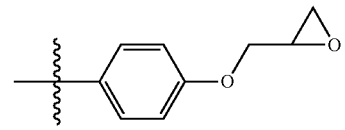

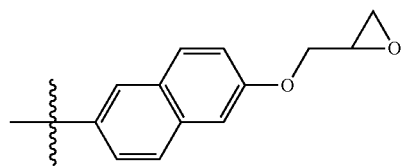

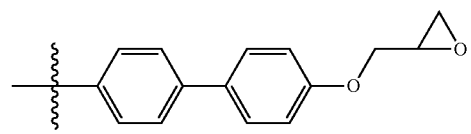

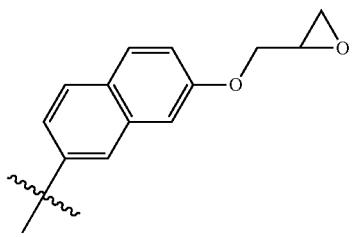

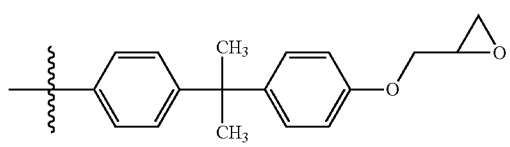

Further, $R^{11}$ and $R^{12}$ may form a ring structure, and the ring structure is preferably a 5- to 7-membered ring. Specific examples of $R^{11}$ and $R^{12}$ in cases where they form a ring structure include the following substituents.

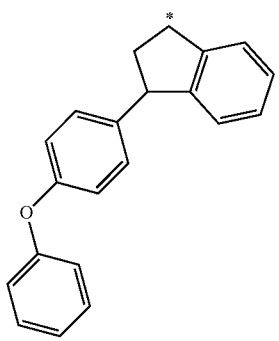

-continued
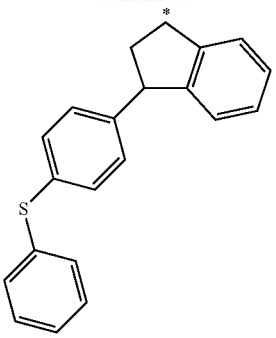
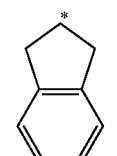
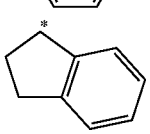
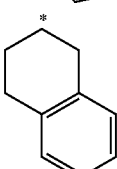
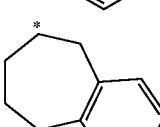
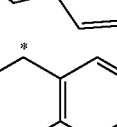
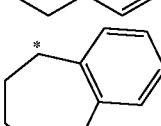
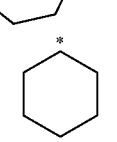
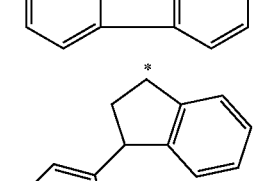
-continued
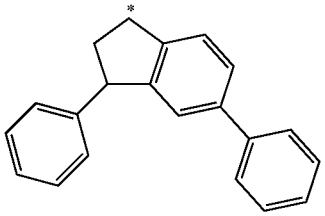
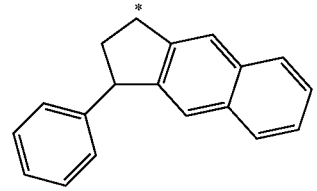
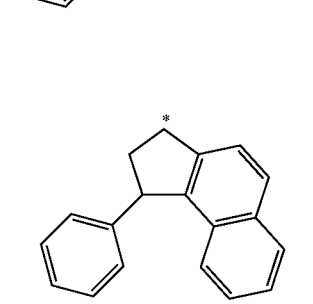
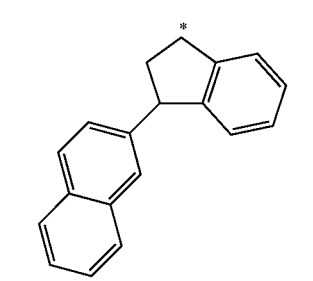
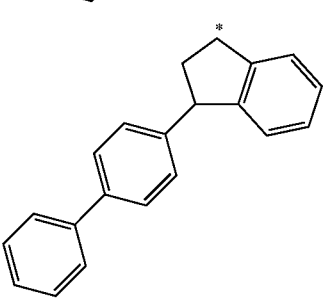
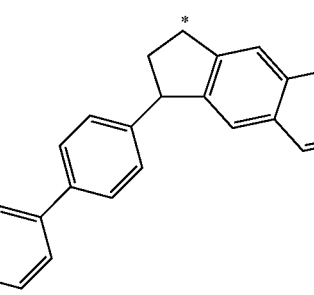

-continued
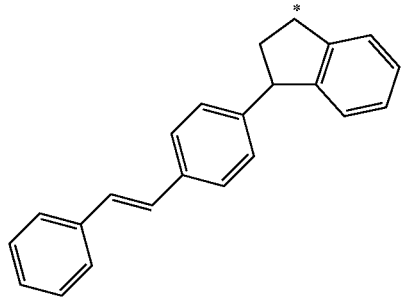
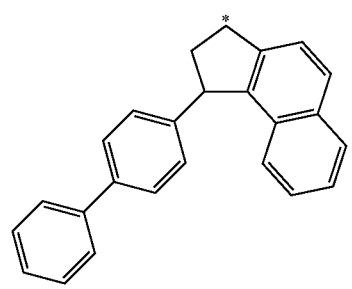
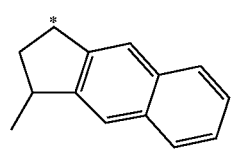
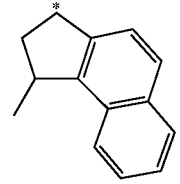
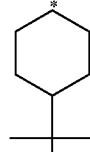
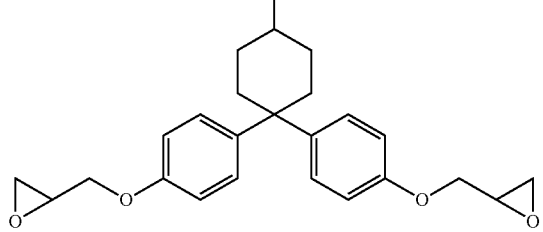
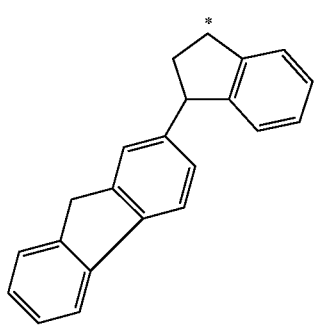
-continued
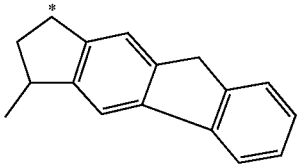
(Carbons with * are those corresponding to the carbons with * in General Formula (5))
Examples of the multifunctional epoxy compound include the following compounds.
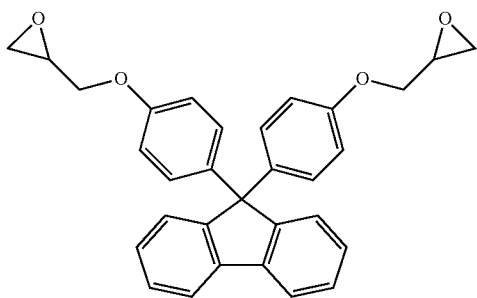
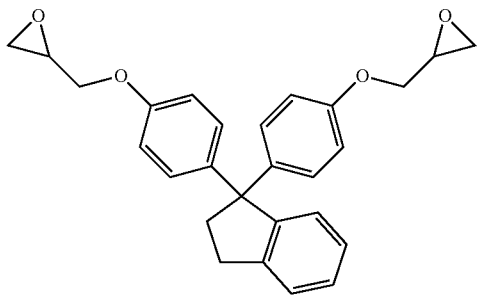
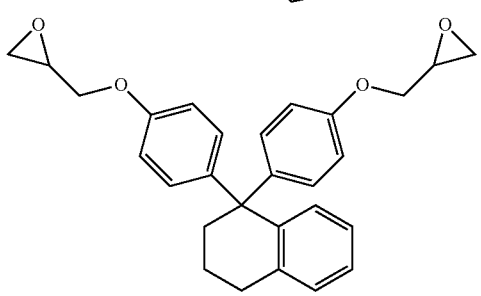
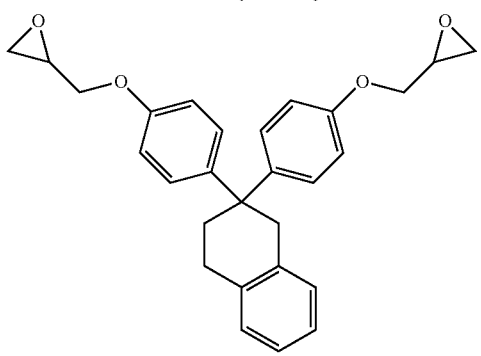

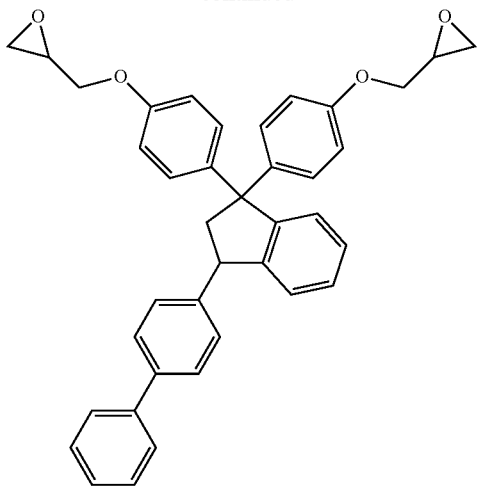

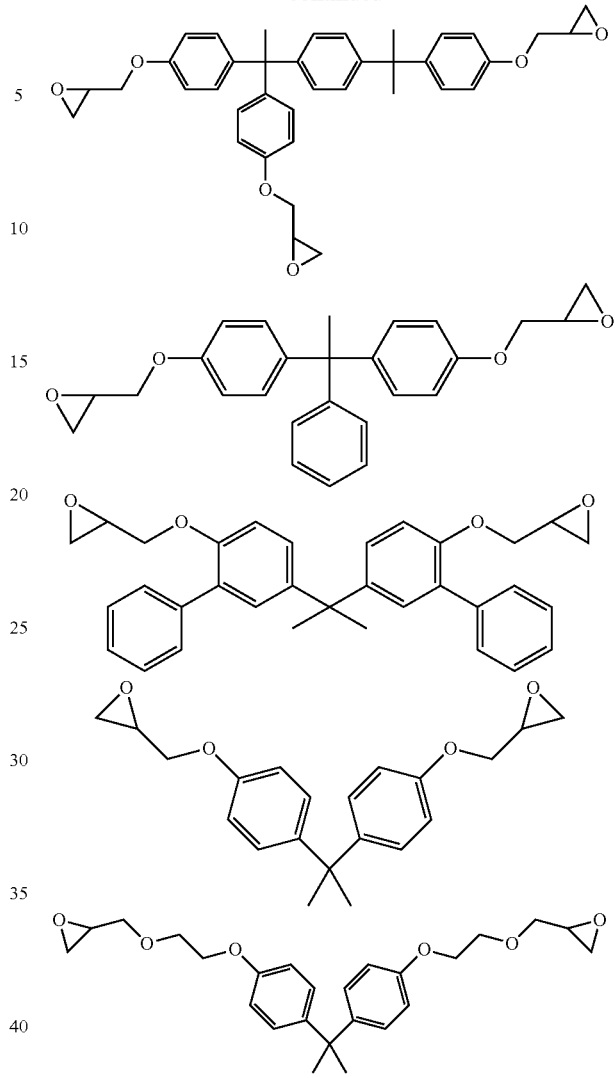

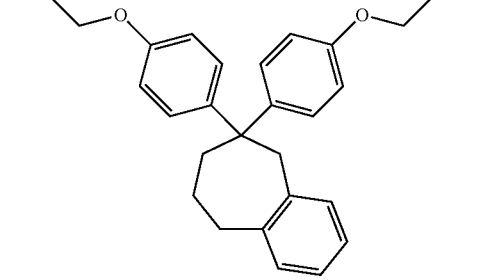

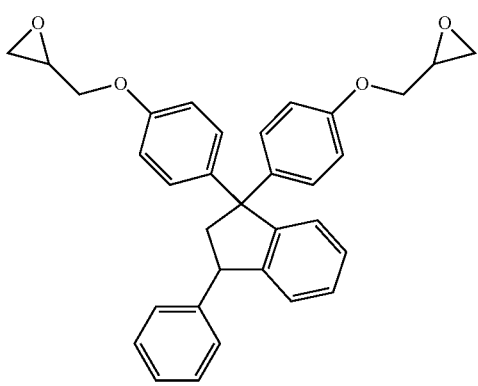

Examples of the polycarboxylic acid compound include succinic acid, maleic acid, fumaric acid, itaconic acid, phthalic acid, terephthalic acid, isophthalic acid, trimellitic acid, pyromellitic acid, 2,2'-biphenyldicarboxylic acid and 4,4'-biphenyldicarboxylic acid. In order to improve the chemical resistance and insulation properties of the cured layer and the like, phthalic acid, terephthalic acid, isophthalic acid, trimellitic acid, pyromellitic acid, 2,2'-biphenyldicarboxylic acid or 4,4'-biphenyldicarboxylic acid is preferred.

Examples of the polyol compound include aliphatic alcohol compounds such as ethylene glycol, propylene glycol, butylene glycol, glycerin, trimethylolpropane and pentaerythritol; and aromatic alcohol compounds such as 9,9-bis[4-(2-hydroxyethoxy)phenyl]fluorene, compounds obtained by reacting a multifunctional epoxy compound and a radical polymerizable group-containing monobasic acid compound, and compounds obtained by reacting a bisphenol compound represented by General Formula (6) below and a radical polymerizable group-containing epoxy compound. Aromatic alcohol compounds are preferred. $R^{11}$, $R^{12}$, $R^{13}$ and $R^{14}$ in General Formula (6) are the same as those defined in General Formula (5).

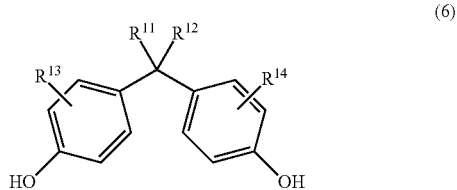

(6)

Examples of the dianhydride include: aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)hexafluoropropane dianhydride, 2,2-bis(2,3-dicarboxyphenyl)hexafluoropropane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 2,3,6,7-naphthalenetetracarboxylic dianhydride, 2,3,5,6-pyridinetetracarboxylic dianhydride and 3,4,9,10-perylenetetracarboxylic dianhydride; and aliphatic tetracarboxylic dianhydrides such as butanetetracarboxylic dianhydride, cyclobutanetetracarboxylic dianhydride, 1,2,3,4-cyclopentanetetracarboxylic dianhydride, cyclohexane tetracarboxylic dianhydride, bicyclo[2.2.1.]heptantetracarboxylic dianhydride, bicyclo[3.3.1.]tetracarboxylic dianhydride, bicyclo[3.1.1.]hept-2-ene-tetracarboxylic dianhydride, bicyclo[2.2.2.]octanetetracarboxylic dianhydride and adamantanetetracarboxylic dianhydride. In order to improve the chemical resistance and insulation properties of the cured layer and the like, pyromellitic dianhydride, 3,3',4,4'-biphenyltetracarboxylic dianhydride, 2,3,3',4'-biphenyltetracarboxylic dianhydride or 2,2',3,3'-biphenyltetracarboxylic dianhydride is preferred. In order to improve the transparency of the cured layer and the like, cyclobutanetetracarboxylic dianhydride, 1,2,3,4-cyclopentanetetracarboxylic dianhydride or cyclohexane tetracarboxylic dianhydride is preferred.

Examples of the radical polymerizable group-containing monobasic acid compound include (meth)acrylic acid, mono(2-(meth)acryloyloxyethyl) succinate, mono(2-(meth)acryloyloxyethyl) phthalate, mono(2-(meth)acryloyloxyethyl) tetrahydrophthalate, p-hydroxystyrene and the like.

Examples of the radical polymerizable group-containing epoxy compound include glycidyl(meth)acrylate, α-ethylglycidyl(meth)acrylate, α-n-propylglycidyl(meth)acrylate, α-n-butylglycidyl(meth)acrylate, 3,4-epoxybutyl(meth)acrylate, 3,4-epoxyheptyl(meth)acrylate, α-ethyl-6,7-epoxyheptyl(meth)acrylate, butyl vinyl ether, butyl allyl ether, 2-hydroxyethyl vinyl ether, 2-hydroxyethyl allyl ether, cyclohexane vinyl ether, cyclohexane allyl ether, 4-hydroxybutyl vinyl ether, 4-hydroxybutyl allyl ether, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene.

Examples of the acid anhydride include succinic anhydride, maleic anhydride, itaconic anhydride, phthalic anhydride, trimellitic anhydride, pyromellitic monoanhydride, 2,3-biphenyldicarboxylic anhydride, 3,4-biphenyldicarboxylic anhydride, hexahydrophthalic anhydride, glutaric anhydride, 3-methylphthalic anhydride, norbornenedicarboxylic anhydride, cyclohexene dicarboxylic anhydride and 3-trimethoxysilylpropyl succinic anhydride.

The acrylic resin used in the formation of organic thin layer (II) is preferably a carboxyl group-containing acrylic resin, from the viewpoint of patternability. From the viewpoint of the hardness of the cured layer, it is preferred that an ethylenically unsaturated double bond group(s) be introduced into at least one part of the carboxyl group-containing acrylic resin. Examples of methods for synthesizing the acrylic resin include radical polymerization of (meth)acrylic compounds.

Examples of the (meth)acrylic compound include carboxyl group- and/or acid anhydride group-containing (meth)acrylic compounds and other (meth)acrylic acid esters. As a radical polymerization catalyst, an azo compound such as azobisisobutyronitrile or an organic peroxide such as benzoyl peroxide is generally used. Although the conditions for the radical polymerization may be set as appropriate, it is preferred that the polymerization be carried out as follows: a carboxyl group- and/or acid anhydride group-containing (meth)acrylic compound, another (meth)acrylic acid ester(s) and a radical polymerization catalyst are added to a solvent, and after sufficiently replacing the interior of the reactor with nitrogen by bubbling, degassing under reduced pressure, or the like, the resultant is reacted at 60 to 110° C. for 30 to 300 minutes. In cases where an acid anhydride group-containing (meth)acrylic compound is used, it is preferred that a stoichiometric amount of water be added, and the reaction be allowed to proceed at 30 to 60° C. for 30 to 60 minutes. Further, a chain transfer agent such as a thiol compound or the like may also be used as necessary.

Examples of the (meth)acrylic compound used for the synthesis of the acrylic resin include (meth)acrylic acid, (meth)acrylic anhydride, itaconic acid, itaconic anhydride, mono(2-acryloyloxyethyl) succinate, mono(2-acryloyloxyethyl) phthalate, mono(2-acryloyloxyethyl)tetrahydrophthalate, methyl(meth)acrylate, ethyl(meth)acrylate, propyl(meth)acrylate, cyclopropyl(meth)acrylate, cyclopentyl(meth)acrylate, cyclohexyl(meth)acrylate, cyclohexenyl(meth)acrylate, 4-methoxycyclohexyl(meth)acrylate, 2-cyclopropyloxycarbonylethyl(meth)acrylate, 2-cyclopentyloxycarbonylethyl(meth)acrylate, 2-cyclohexyloxycarbonylethyl(meth)acrylate, 2-cyclohexenyloxycarbonylethyl(meth)acrylate, 2-(4-methoxycyclohexyl)oxycarbonylethyl(meth)acrylate, norbornyl(meth)acrylate, isobornyl(meth)acrylate, tricyclodecanyl(meth)acrylate, tetracyclodecanyl(meth)acrylate, dicyclopentenyl(meth)acrylate, adamantyl(meth)acrylate, adamantylmethyl(meth)acrylate, 1-methyladamantyl(meth)acrylate, glycidyl(meth)acrylate, α-ethylglycidyl(meth)acrylate, α-n-propylglycidyl(meth)acrylate, α-n-butylglycidyl(meth)acrylate, 3,4-epoxybutyl(meth)acrylate, 3,4-epoxyheptyl(meth)acrylate, α-ethyl-6,7-epoxyheptyl(meth)acrylate and benzyl methacrylate. From the viewpoint of developability, (meth)acrylic acid is more preferred, and from the viewpoint of heat resistance, isobornyl(meth)acrylate, tricyclodecanyl(meth)acrylate or dicyclopentenyl(meth)acrylate is more preferred.

Further, the acrylic resin may be a copolymer of a (meth)acrylic compound with other unsaturated double bond-containing monomer(s). Examples of the other unsaturated double bond-containing monomer include, styrene, p-methylstyrene, o-methylstyrene, m-methylstyrene, α-methylstyrene, p-hydroxystyrene, maleic anhydride, norbornene, norbornenedicarboxylic acid, norbornenedicarboxylic anhydride, cyclohexene, butyl vinyl ether, butyl allyl ether, 2-hydroxyethyl vinyl ether, 2-hydroxyethyl allyl ether, cyclohexane vinyl ether, cyclohexane allyl ether, 4-hydroxybutyl vinyl ether, 4-hydroxybutyl allyl ether, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene and 2,4,6-triglycidyloxymethyl styrene. Styrene is preferred because the resistance of the cured layer to moist heat is improved and the corrosion resistance of metals such as ITO is improved.

The acrylic resin containing an ethylenically unsaturated bond is preferably one obtained by radical polymerization of a carboxyl group- and/or acid anhydride group-containing (meth)acrylic compound, a (meth)acrylic acid ester and/or other unsaturated double bond-containing monomer(s), followed by the addition reaction of an epoxy compound containing an ethylenically unsaturated double bond group. Examples of the catalyst used in the addition reaction include amino catalysts such as dimethylaniline, 2,4,6-tris (dimethylaminomethyl)phenol and dimethylbenzylamine; tin catalysts such as tin(II) 2-ethylhexanoate and dibutyl tin laurate; titanium catalysts such as titanium(IV) 2-ethylhexanoate; phosphorus catalysts such as triphenylphosphine; and chromium catalysts such as chromium acetylacetonate and chromium chloride.

Examples of the epoxy compound containing an ethylenically unsaturated double bond group include glycidyl (meth)acrylate, α-ethylglycidyl(meth)acrylate, α-n-propylglycidyl(meth)acrylate, α-n-butylglycidyl(meth)acrylate, 3,4-epoxybutyl(meth)acrylate, 3,4-epoxyheptyl(meth)acrylate, α-ethyl-6,7-epoxyheptyl(meth)acrylate, butyl vinyl ether, butyl allyl ether, 2-hydroxyethyl vinyl ether, 2-hydroxyethyl allyl ether, cyclohexane vinyl ether, cyclohexane allyl ether, 4-hydroxybutyl vinyl ether, 4-hydroxybutyl allyl ether, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene, 2,4,6-triglycidyloxymethyl styrene and the like.

The Mw of the acrylic resin used in the formation of organic thin layer (II) is preferably from 2,000 to 200,000 in terms of polystyrene as measured by GPC. If the Mw is within the above described range, good coating properties and a good solubility in a developer upon patterning can be obtained.

As the polysiloxane used in the formation of organic thin layer (II), one containing a phenyl group or a naphthyl group is preferred from the viewpoint of the storage stability of the coating solution, one containing an epoxy group or an amino group is preferred from the viewpoint of chemical resistance, one containing a (meth)acrylic group or a vinyl group is preferred from the viewpoint of curing performance, and one containing a carboxyl group or a phenolic hydroxyl group is preferred from the viewpoint of patternability. The polysiloxane is generally synthesized by hydrolysis-condensation of an organosilane compound. Examples of the organosilane compound used for the synthesis of the polysiloxane include methyltrimethoxysilane, methyltriethoxysilane, ethyltrimethoxysilane, ethyltriethoxysilane, hexyltrimethoxysilane, octadecyltrimethoxysilane, octadecyltriethoxysilane, phenyltrimethoxysilane, phenyltriethoxysilane, diphenyldimethoxysilane, diphenyldiethoxysilane, 1-naphthyltrimethoxysilane, 2-naphthyltrimethoxysilane, 1-naphthyltriethoxysilane, 2-naphthyltriethoxysilane, 4-hydroxyphenyltrimethoxysilane, 4-hydroxyphenyltriethoxysilane, 4-hydroxybenzyltrimethoxysilane, 4-hydroxybenzyltriethoxysilane, 2-(4-hydroxyphenyl)ethyltrimethoxysilane, 2-(4-hydroxyphenyl)ethyltriethoxysilane, 3-aminopropyltriethoxysilane, N-(2-aminoethyl)-3-aminopropyltrimethoxysilane, 3-chloropropyltrimethoxysilane, 3-(N,N-diglycidyl)aminopropyltrimethoxysilane, 3-glycidoxypropyltrimethoxysilane, γ-aminopropyltrimethoxysilane, γ-aminopropyltriethoxysilane, N-β-(aminoethyl)-γ-aminopropyltrimethoxysilane, β-cyanoethyltriethoxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, 2-(3,4-epoxycyclohexyl)ethyltripropoxysilane, 2-(3,4-epoxycyclohexyl)ethyltributoxysilane, 2-(3,4-epoxycyclohexyl)ethyltrimethoxysilane, 2-(3,4-epoxycyclohexyl)ethyltriethoxysilane, 2-(3,4-epoxycyclohexyl)ethyltriphenoxysilane, 3-(3,4-epoxycyclohexyl)propyltrimethoxysilane, 3-(3,4-epoxycyclohexyl)propyltriethoxysilane, 4-(3,4-epoxycyclohexyl)butyltrimethoxysilane, 4-(3,4-epoxycyclohexyl)butyltriethoxysilane, dimethyldimethoxysilane, dimethyldiethoxysilane, γ-glycidoxypropylmethyldimethoxysilane, γ-aminopropylmethyldimethoxysilane, γ-aminopropylmethyldiethoxysilane, N-(2-aminoethyl)-3-aminopropylmethyldimethoxysilane, glycidoxymethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylmethyldiethoxysilane, α-glycidoxypropylmethyldimethoxysilane, α-glycidoxypropylmethyldiethoxysilane, β-glycidoxypropylmethyldimethoxysilane, β-glycidoxypropylmethyldiethoxysilane, γ-glycidoxypropylmethyldimethoxysilane, γ-glycidoxypropylmethyldiethoxysilane, γ-glycidoxypropylethyldimethoxysilane, γ-glycidoxypropylethyldiethoxysilane, 3-chloropropylmethyldimethoxysilane, 3-chloropropylmethyldiethoxysilane, cyclohexylmethyldimethoxysilane, octadecylmethyldimethoxysilane, tetramethoxysilane, tetraethoxysilane, methyl silicate, trifluoromethyltrimethoxysilane, trifluoromethyltriethoxysilane, trifluoropropyltrimethoxysilane, trifluoropropyltriethoxysilane, 3-trimethoxysilyl propionic acid, 3-triethoxysilyl propionic acid, 3-dimethylmethoxysilyl propionic acid, 3-dimethylethoxysilyl propionic acid, 4-trimethoxysilyl butyric acid, 4-triethoxysilyl butyric acid, 4-dimethylmethoxysilyl butyric acid, 4-dimethylethoxysilyl butyric acid, 5-trimethoxysilyl valeric acid, 5-triethoxysilyl valeric acid, 5-dimethylmethoxysilyl valeric acid, 5-dimethylethoxysilyl valeric acid, 3-trimethoxysilylpropyl succinic anhydride, 3-triethoxysilylpropyl succinic anhydride, 3-dimethylmethoxysilylpropyl succinic anhydride, 3-dimethylethoxysilylpropyl succinic anhydride, 3-trimethoxysilylpropyl cyclohexyl dicarboxylic anhydride, 3-triethoxysilylpropyl cyclohexyl dicarboxylic anhydride, 3-dimethylmethoxysilylpropyl cyclohexyl dicarboxylic anhydride, 3-dimethylethoxysilylpropyl cyclohexyl dicarboxylic anhydride, 3-trimethoxysilylpropyl phthalic anhydride, 3-triethoxysilylpropyl phthalic anhydride, 3-dimethylmethoxysilylpropyl phthalic anhydride, 3-dimethylethoxysilylpropyl phthalic anhydride, vinyltrimethoxysilane, vinyltriethoxysilane, vinylmethyldimethoxysilane, vinylmethyldiethoxysilane, allyltrimethoxysilane, allyltriethoxysilane, allylmethyldimethoxysilane, allylmethyldiethoxysilane, styryltrimethoxysilane, styryltriethoxysilane, styrylmethyldimethoxysilane, styrylmethyldiethoxysilane, γ-acryloylpropyltrimethoxysilane, γ-acryloylpropyltriethoxysilane, γ-methacryloylpropyltrimethoxysilane, γ-methacryloylpropyltriethoxysilane, γ-methacryloylpropylmethyldimethoxysilane, γ-methacryloylpropylmethyldiethoxysilane, γ-acryloylpropylmethyldimethoxysilane and γ-acryloylpropylmethyldiethoxysilane.

Although the conditions for the hydrolysis reaction of the organosilane compound may be set as appropriate, it is preferred that the hydrolysis reaction be performed, for example, by adding an acid catalyst and water to the organosilane compound in a solvent over 1 to 180 minutes; and then by reacting the resultant at a temperature of from room temperature to 110° C. for 1 to 180 minutes. Performing the hydrolysis reaction under such conditions serves to inhibit the occurrence of rapid reaction. The reaction temperature is preferably from 30 to 105° C. Further, the hydrolysis reaction is preferably performed under the presence of an acid catalyst. As the acid catalyst, an acid aqueous solution containing formic acid, acetic acid or phosphoric acid is preferred. The content of the acid catalyst is preferably from 0.1 to 5 parts by weight relative to 100 parts by weight of the total organosilane compound used in the hydrolysis reaction. If the content of the acid catalyst is within the above described range, the hydrolysis reaction can be controlled to proceed as necessary and sufficiently. After obtaining a silanol compound by the hydrolysis reaction of the organosilane compound, condensation reaction is preferably carried out by heating the resulting reaction solution as it is at a temperature of from 50° C. to the boiling point of the solvent for 1 to 100 hours. Further, in order to increase the degree of polymerization of the polysiloxane, the reaction solution may be re-heated or a base catalyst may be added to the reaction solution. In addition, an appropriate amount of the generated alcohol and the like may be removed by distillation through heating and/or decompression, after the hydrolysis reaction as necessary, followed by the addition of an arbitrary solvent.

The Mw of the polysiloxane used in the formation of organic thin layer (II) is preferably from 1,000 to 100,000 in terms of polystyrene as measured by GPC. If the Mw is within the above described range, good coating properties and a good solubility in a developer upon patterning can be obtained.

Organic thin layer (II) preferably contains metal oxide particles. By containing the metal oxide particles, the refractive index of organic thin layer (II) can be controlled to the desired range. The number average particle diameter of the metal oxide particles is preferably from 1 to 200 nm. In order to obtain a cured layer having a high transmittance, it is more preferably from 1 to 70 nm. Here, the number average particle diameter of the metal oxide particles can be measured by transmission electron microscope. As the metal oxide particles, those having a high refractive index by themselves are preferred. More specifically, particles of titanium oxides such as titanium oxide particles and barium titanate particles, or particles of zirconium oxides such as zirconium oxide particles are preferred.

The metal oxide particles can be prepared by obtaining an appropriate metal oxide nanoparticle powder and by grinding or dispersing the powder using a disperser such as a bead mill. Examples of commercially available nanoparticle powders include T-BTO-020RF (barium titanate; manufactured by Toda Kogyo Corp.), UEP-100 (zirconium oxide; manufactured by Daiichi Kigenso Kagaku Kogyo Co., Ltd.) and STR-100N (titanium oxide; manufactured by Sakai Chemical Industry Co., Ltd.). These nanoparticle powders can also be obtained in the form of dispersion. Examples of silicon oxide-titanium oxide particles include "OPTOLAKE" (registered trademark) TR-502, "OPTOLAKE" TR-503, "OPTOLAKE" TR-504, "OPTOLAKE" TR-513, "OPTOLAKE" TR-520, "OPTOLAKE" TR-527, "OPTOLAKE" TR-528, "OPTOLAKE" TR-529, "OPTOLAKE" TR-544 and "OPTOLAKE" TR-550 (all of the above manufactured by JGC C&C). Examples of the zirconium oxide particles include Bairaru Zr-C20 (average diameter=20 nm; manufactured by Taki Chemical Co., Ltd), ZSL-10A (average diameter=from 60 to 100 nm; manufactured by Daiichi Kigenso Kagaku Kogyo Co., Ltd.), NanoUse OZ-30M (average diameter=7 nm; manufactured by Nissan Chemical Industries, Ltd.), SZR-M (manufactured by Sakai Chemical Industry Co., Ltd.) and HXU-120JC (manufactured by Sumitomo Osaka Cement Co., Ltd.).

In general, the content of the metal oxide particles in the solid components in the resin composition is from 1 to 75% by weight.

The solids concentration of the resin composition used in the formation of organic thin layer (II) is preferably from 0.1 to 10 wt %, because the film thickness of organic thin layer (II) can be easily controlled.

The resin composition used in the formation of organic thin layer (II) may be a photosensitive resin composition, and it may be a positive-tone or a negative-tone photosensitive resin composition.

In cases where the above described photosensitive resin composition is a positive-tone photosensitive resin composition, a quinonediazide compound is preferred as a component imparting photosensitivity. A mixture of a quinonediazide compound and an alkali-soluble resin forms a positive-tone pattern by exposure and alkaline development. As the quinonediazide compound, a compound obtained by binding a naphthoquinonediazide sulfonic acid to a compound containing a phenolic hydroxyl group via an ester bond is preferred, and the thus obtained compound having a hydrogen atom or a substituent represented by General Formula (7) below at each of the ortho position and the para position of the phenolic hydroxyl group thereof, independently, is used.

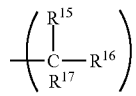
(7)

Each of $R^{15}$ to $R^{17}$ may be the same or different, and represents any of an alkyl group having from 1 to 10 carbon atoms, a carboxyl group, a phenyl group or a substituted phenyl group; or $R^{15}$ and $R^{16}$, $R^{15}$ and $R^{17}$, or $R^{16}$ and $R^{17}$ may form a ring.

In the substituent represented by General Formula (7), each of $R^{15}$ to $R^{17}$ may be the same or different, and represents any of a substituted or unsubstituted alkyl group having from 1 to 10 carbon atoms, a carboxyl group, a phenyl group or a substituted phenyl group. Examples of the alkyl group include methyl, ethyl, n-propyl, isopropyl, n-butyl, isobutyl, t-butyl, n-hexyl, cyclohexyl, n-heptyl, n-octyl, trifluoromethyl and 2-carboxy ethyl. Examples of the substituent which substitutes the hydrogen atom(s) of the phenyl group include hydroxyl. Further, examples of the ring formed by $R^{15}$ and $R^{16}$, $R^{15}$ and $R^{17}$, or $R^{16}$ and $R^{17}$ include cyclopentane ring, cyclohexane ring, adamantane ring or fluorene ring.

In cases where each of the ortho position and the para position of the phenolic hydroxyl group is occupied by one other than a hydrogen atom or a substituent represented by General Formula (7), an oxidative degradation occurs due to heat curing, and a conjugated compound represented by a quinoid structure is thereby formed, resulting in the coloration of the cured layer and in a decrease in the colorless transparency. The quinonediazide compound can be synthesized by the well-known esterification reaction of a compound containing a phenolic hydroxyl group with a naphthoquinonediazide sulfonic acid chloride.

Examples of the compound containing a phenolic hydroxyl group include the following compounds (manufactured by Honshu Chemical Industry Co., Ltd.).

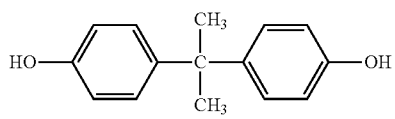

Bisphenol A

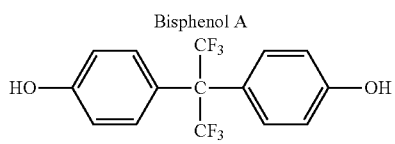

BisP-AF

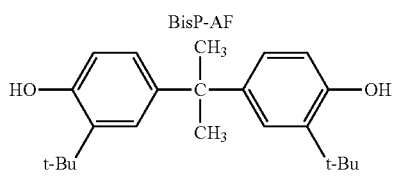

BisOTBP-A

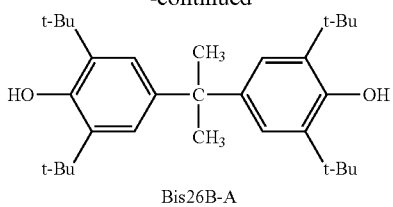

Bis26B-A

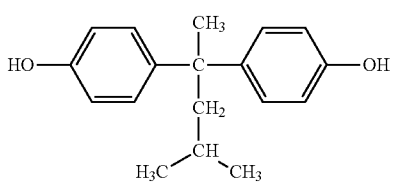

BisP-MIBK

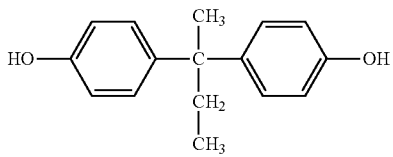

BisP-B

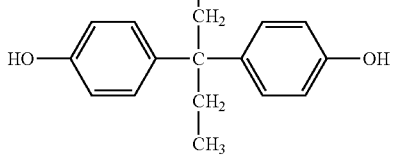

BisP-DEK

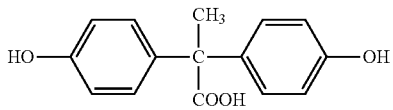

BisP-PR

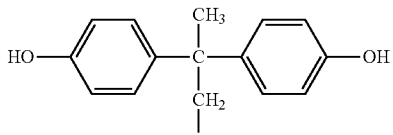

BisP-LV

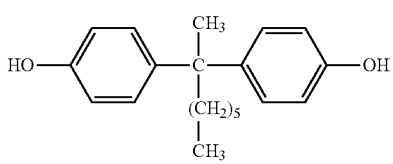

BisP-OT

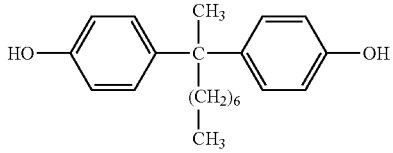

BisP-NO

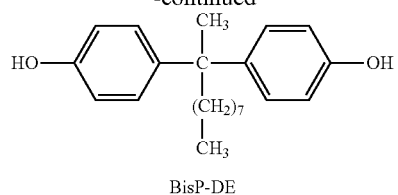
BisP-DE
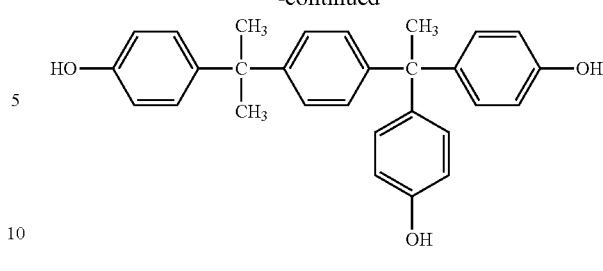
TrisP-PA
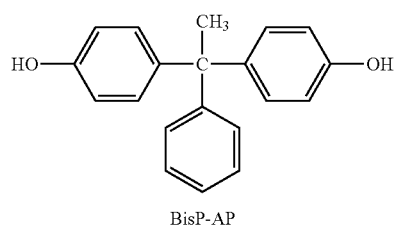
BisP-AP
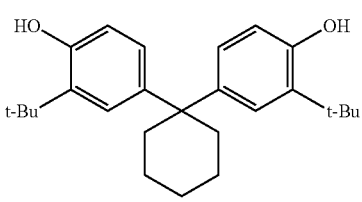
BisOTBP-Z
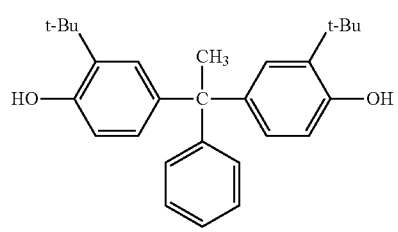
BisOTBP-AP
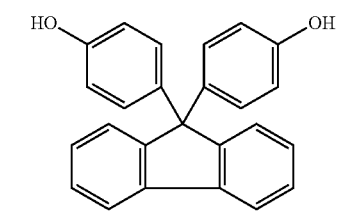
BisP-FL
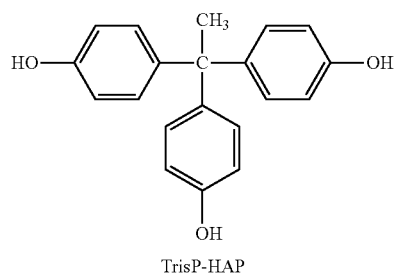
TrisP-HAP
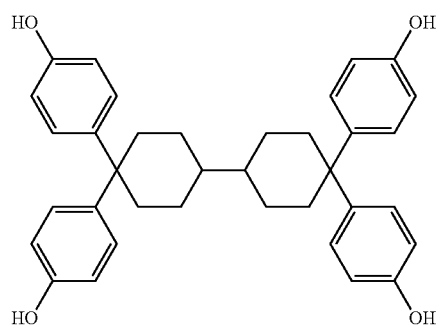
TekP-4HBP
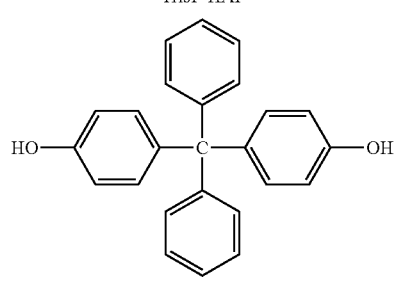
BisP-DP
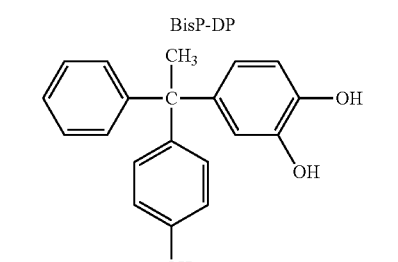
Phcc-AP
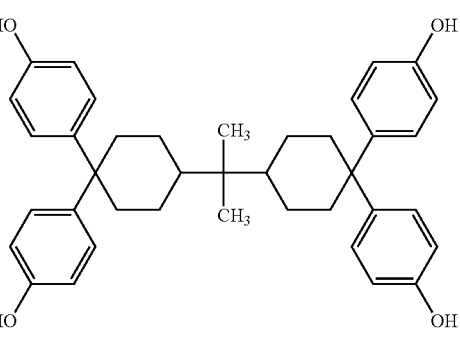
TekP-4HBPA

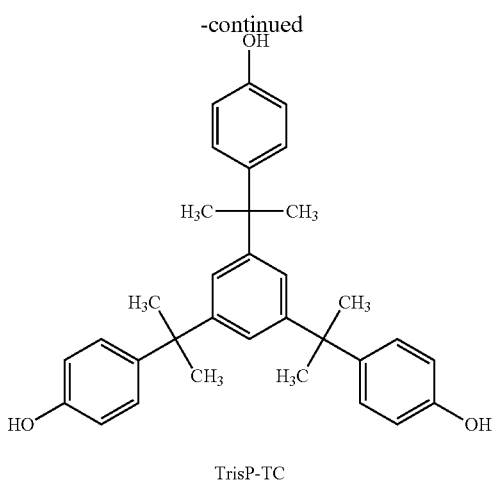

TrisP-TC

Examples of the naphthoquinonediazide sulfonic acid include 4-naphthoquinonediazide sulfonic acid and 5-naphthoquinonediazide sulfonic acid. For i-ray exposure, a 4-naphthoquinonediazide sulfonic acid ester compound is suitable, since it has an absorption in the i-ray (wavelength 365 nm) range. Further, a 5-naphthoquinonediazide sulfonic acid ester compound is suitable for exposure in a wide wavelength range, since it absorbs a wide range of wavelengths. It is preferred that the 4-naphthoquinonediazide sulfonic acid ester compound or the 5-naphthoquinonediazide sulfonic acid ester compound be selected as appropriate, depending on the wavelength to be exposed. The 4-naphthoquinonediazide sulfonic acid ester compound and the 5-naphthoquinonediazide sulfonic acid ester compound may be used in combination.

The molecular weight of the naphthoquinonediazide compound is preferably from 300 to 1,500, more preferably, from 350 to 1,200. If the molecular weight of the naphthoquinonediazide compound is greater than 1,500, it may result in a failure to form a pattern when the content of the compound is from 4 to 10% by weight. On the other hand, if the molecular weight of the naphthoquinonediazide compound is less than 300, it may result in a decrease in the colorless transparency.

In cases where the photosensitive resin composition is a negative-tone photosensitive resin composition, a photopolymerization initiator and a multifunctional monomer are preferable as the components imparting photosensitivity.

The photopolymerization initiator which is a component imparting photosensitivity is preferably one that undergoes degradation and/or reaction by light (including ultraviolet light and electron beam) to generate radicals. Examples of the photopolymerization initiator which undergoes degradation and/or reaction by light to generate radicals include 2-methyl-[4-(methylthio)phenyl]-2-morpholinopropan-1-one, 2-dimethylamino-2-(4-methylbenzyl)-1-(4-morpholin-4-yl-phenyl)-butan-1-one, 2-benzyl-2-dimethylamino-1-(4-morpholinophenyl)-butanone-1,2,4,6-trimethylbenzoylphenylphosphine oxide, bis(2,4,6-trimethylbenzoyl)-phenylphosphine oxide, bis(2,6-dimethoxybenzoyl)-(2,4,4-trimethylpentyl)-phosphine oxide, 1-phenyl-1,2-propanedione-2-(o-ethoxycarbonyl)oxime, 1,2-octanedione, 1-[4-(phenylthio)-2-(O-benzoyloxime)], 1-phenyl-1,2-butadione-2-(o-methoxycarbonyl)oxime, 1,3-diphenylpropanetrione-2-(o-ethoxycarbonyl)oxime, ethanone, 1-[9-ethyl-6-(2-methylbenzoyl)-9H-carbazol-3-yl]-1-(0-acetyloxime), 4,4-bis(dimethylamino) benzophenone, 4,4-bis(diethylamino)benzophenone, ethyl p-dimethylaminobenzoate, 2-ethylhexyl-p-dimethylaminobenzoate, ethyl p-diethylaminobenzoate, diethoxyacetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl-(2-hydroxy-2-propyl)ketone, 1-hydroxycyclohexyl-phenyl ketone, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzoyl-N,N-dimethyl-N-[2-(1-oxo-2-propenyl oxy)ethyl]benzenemethanaminium bromide, (4-benzoylbenzyl)trimethylammonium chloride, 2-hydroxy-3-(4-benzoylphenoxy)-N,N,N-trimethyl-1-propenaminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenylglyoxy ester, η5-cyclopentadienyl-η6-cumenyl-iron(1+)-hexafluorophosphate(1−), diphenyl sulfide derivative, bis(η5-2,4-cyclopentadien-1-yl)-bis(2,6-difluoro-3-(1H-pyrrol-1-yl)-phenyl)titanium, thioxanthone, 2-methylthioxanthone, 2-chlorothioxanthone, 4-benzoyl-4-methyl phenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzyl methoxyethyl acetal, anthraquinone, 2-t-butylanthraquinone, 2-aminoanthraquinone, β-chloroanthraquinone, anthrone, benzanthrone, dibenzsuberone, methyleneanthrone, 4-azidobenzalacetophenone, 2,6-bis(p-azidobenzylidene)cyclohexane, 2,6-bis(p-azidobenzylidene)-4-methylcyclohexanone, naphthalenesulfonyl chloride, quinolinesulfonyl chloride, N-phenylthioacridone, benzthiazole disulfide, triphenylphosphine, carbon tetrabromide, tribromophenylsulfone, benzoyl peroxide and eosin; and a combination of a photoreducing dye such as methylene blue and a reducing agent such as ascorbic acid or triethanolamine. Two or more of these may be contained. In order to further improve the hardness of the cured layer, an α-aminoalkylphenone compound, an acylphosphine oxide compound, an oxime ester compound, a benzophenone compound containing an amino group or a benzoic acid ester compound containing an amino group is preferred.

Examples of the α-aminoalkylphenone compound include 2-methyl-[4-(methylthio)phenyl]-2-morpholinopropan-1-one, 2-dimethylamino-2-(4-methylbenzyl)-1-(4-morpholin-4-yl-phenyl)-butan-1-one and 2-benzyl-2-dimethylamino-1-(4-morpholinophenyl)-butanone-1. Examples of the acylphosphine oxide compound include 2,4,6-trimethylbenzoylphenylphosphine oxide, bis(2,4,6-trimethylbenzoyl)-phenylphosphine oxide and bis(2,6-dimethoxybenzoyl)-(2,4,4-trimethylpentyl)-phosphine oxide. Examples of the oxime ester compound include 1-phenyl-1,2-propanedione-2-(o-ethoxycarbonyl)oxime, 1,2-octanedione, 1-[4-(phenylthio)-2-(O-benzoyloxime)], 1-phenyl-1,2-butadione-2-(o-methoxycarbonyl)oxime, 1,3-diphenylpropanetrione-2-(o-ethoxycarbonyl)oxime and ethanone, 1-[9-ethyl-6-(2-methylbenzoyl)-9H-carbazol-3-yl]-1-(0-acetyloxime). Examples of the benzophenone compound containing an amino group include 4,4-bis(dimethylamino)benzophenone and 4,4-bis(diethylamino) benzophenone. Examples of the benzoic acid ester compound containing an amino group include ethyl p-dimethylaminobenzoate, 2-ethylhexyl-p-dimethylaminobenzoate and ethyl p-diethylaminobenzoate.

Examples of the multifunctional monomer which is the component imparting photosensitivity include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexandiol diacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol pentaacrylate, dipentaerythritol hexaacrylate, tripentaerythritol heptaacrylate, tripentaerythritol octaacrylate, tetrapentaerythritol nonaacrylate, tetrapentaerythritol decaacrylate, pentapentaerythritol undecaacrylate, pentapentaerythritol dodecaacrylate, tripentaerythritol heptamethacrylate, tripentaerythritol octamethacrylate, tetrapentaerythritol nonamethacrylate, tetrapentaerythritol decamethacrylate, pentapentaerythritol undecamethacrylate, pentapentaerythritol dodecamethacrylate, dimethylol-tricyclodecane diacrylate, ethoxylated bisphenol A diacrylate, 9,9-bis[4-(2-acryloyloxyethoxy)phenyl]fluorene, 9,9-bis[4-(2-methacryloyloxyethoxyl)phenyl]fluorene, 9,9-bis[4-(2-methacryloyloxyethoxy)-3-methylphenyl]fluorene, (2-acryloyloxypropoxy)-3-methylphenyl]fluorene, 9,9-bis[4-(2-acryloyloxyethoxy)-3,5-dimethylphenyl]fluorene and 9,9-bis[4-(2-methacryloyloxyethoxy)-3,5-dimethylphenyl]fluorene. Among these, pentaerythritol tetraacrylate, dipentaerythritol pentaacrylate, dipentaerythritol hexaacrylate, tripentaerythritol heptaacrylate or tripentaerythritol octaacrylate is preferred from the viewpoint of improving sensitivity; and dimethylol-tricyclodecane diacrylate, dimethylol-tricyclodecane dimethacrylate, ethoxylated bisphenol A diacrylate or 9,9-bis[4-(2-acryloyloxyethoxyl)phenyl]fluorene is preferred from the viewpoint of improving hydrophobicity.

Examples of the other multifunctional monomer include epoxy(meth)acrylate obtained by reacting a multifunctional epoxy compound with a (meth)acrylic acid. Examples of the multifunctional epoxy compound include the following compounds.

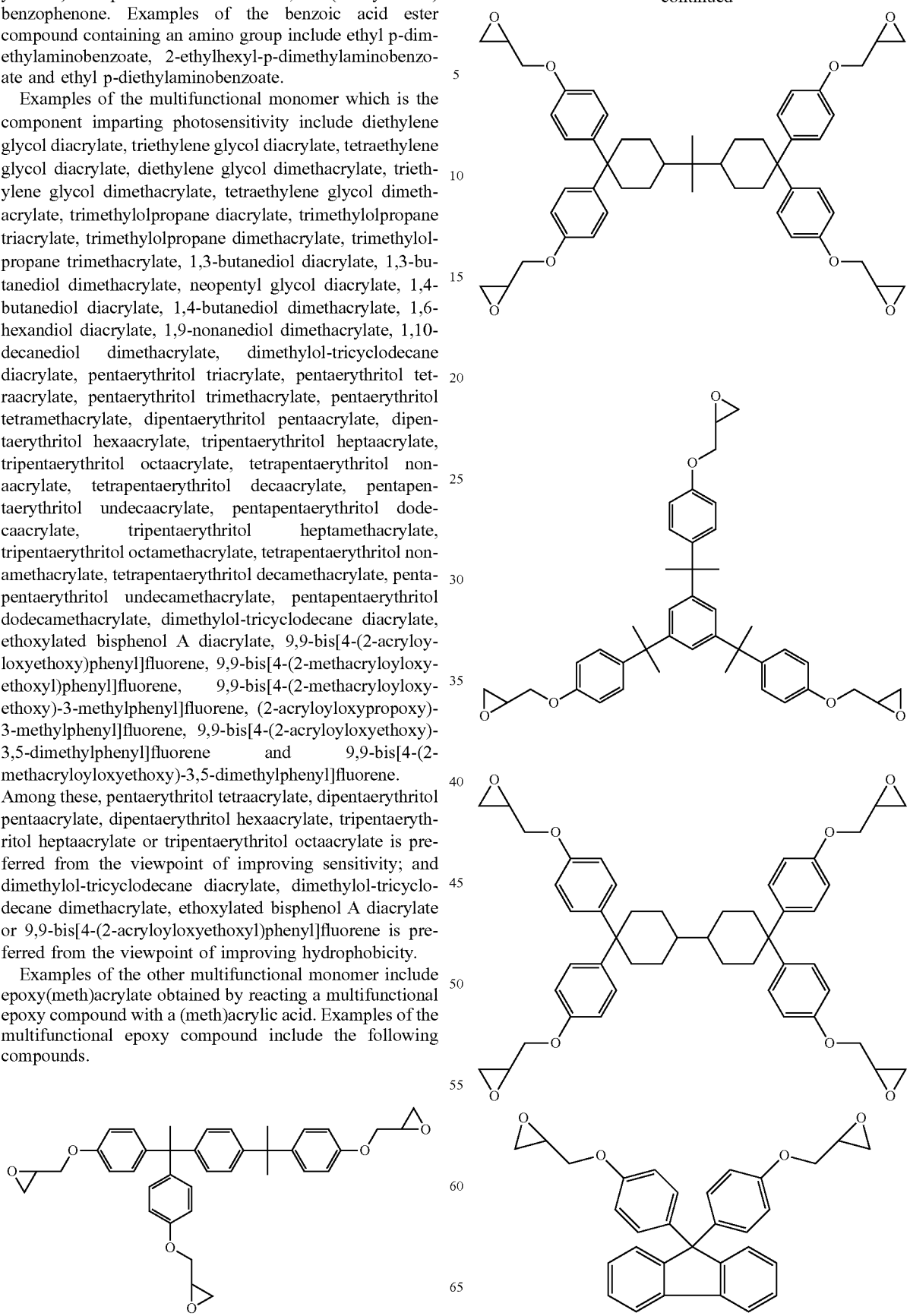

-continued

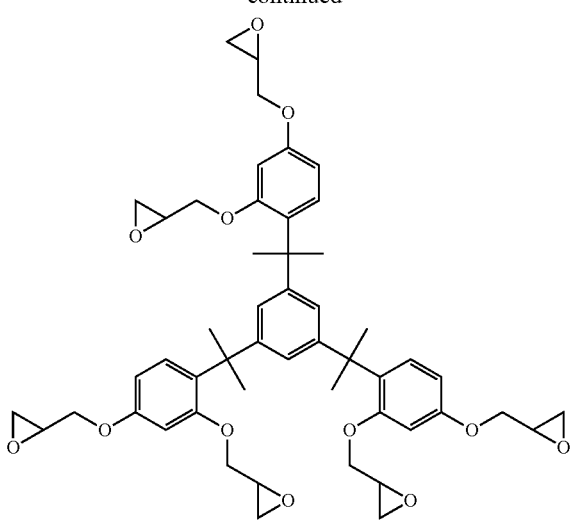

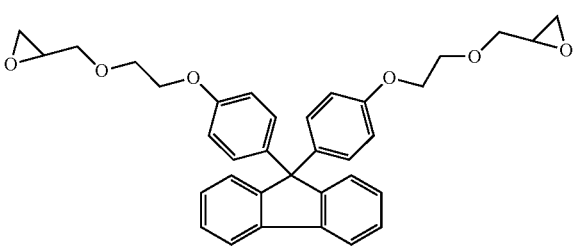

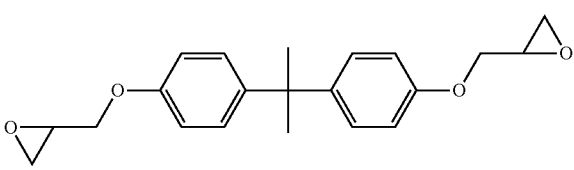

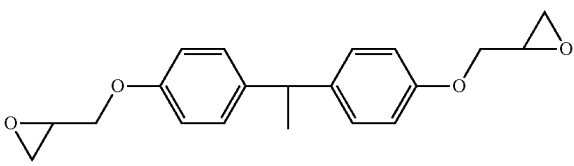

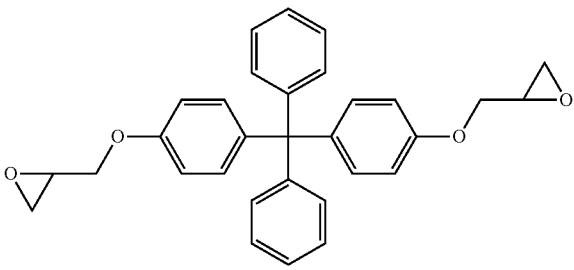

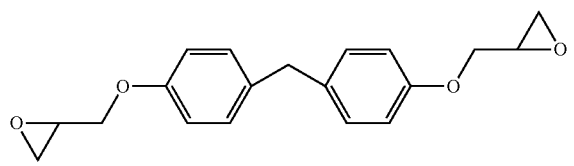

-continued

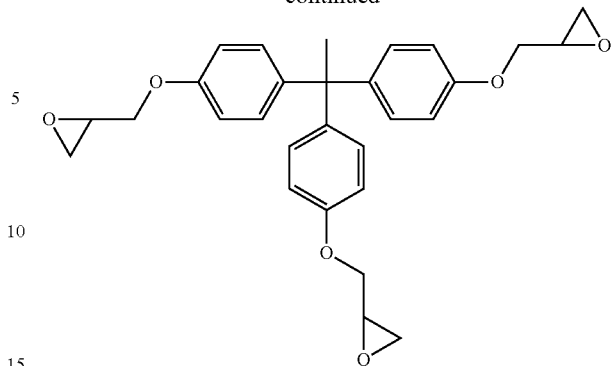

The substrate of an embodiment of the present invention includes a region where a transparent adhesive thin layer (III) having a refractive index of from 1.46 to 1.52 is laminated. If transparent adhesive thin layer (III) has a refractive index of from 1.46 to 1.52, the reflection of light on the upper surface of organic thin layer (II) can be controlled, and the ITO pattern visibility can be further reduced. Transparent adhesive thin layer (III) serves to make the substrate less susceptible to cracks, and at the same time, lamination with another substrate becomes possible.

The film thickness of the transparent adhesive thin layer (III) is preferably from 1 to 200 µm, from the viewpoint of adhesion and transparency.

The adhesive strength (adhesive strength as measured in accordance with JIS Z0237 (2000), which adhesive strength is obtained by crimping a sample having a thickness of 0.05 mm and a width of 25 mm to a glass plate, and by measuring at an angle of 90°, and at a rate of 200 mm/min) of the transparent adhesive is preferably from 3 to 100 N/25 mm. Further, the total light transmittance per thickness of 1 (in accordance with JIS K7361-1) of the transparent adhesive is preferably 90% or more, from the viewpoint the appearance of the touch panel.

Examples of the transparent adhesive include heat curable adhesives and UV curable adhesives. Examples of the heat curable transparent adhesive having a refractive index of from 1.46 to 1.52 include heat curable adhesives comprising as major components a copolymer composed, as constituent monomers, of an alkyl(meth)acrylate(s) having from 1 to 20 carbon atoms, a (meth)acrylate(s) containing a hydroxyl group and/or a (meth)acrylic acid derivative(s) containing a carboxyl group; and a multifunctional isocyanate compound and/or a multifunctional epoxy compound. Examples of the UV curable transparent adhesive having a refractive index of from 1.46 to 1.52 include UV curable adhesives comprising as major components a monofunctional or multifunctional (meth)acrylate monomer and/or oligomer, and a photopolymerization initiator.

As the transparent adhesive as described above, an OCA (Optical Clear Adhesive) material (common name for heat curable adhesives) or an OCR (Optical Clear Adhesive Resin) material (common name for UV curable adhesives), used to paste various types of substrates together, can be used. Further, for the transparent adhesive thin layer (III) formed from the transparent adhesive as described above, an adhesive used in a commercially available multifunctional film such as a shatterproof film can be used.

Examples of the commercially available OCA material capable of forming transparent adhesive thin layer (III) include 8171 CL, 8172CL, 8146-1 and 8146-2 (all four manufactured by Sumitomo 3M Limited); CS9622T, CS9621T and CS9070 (all three manufactured by Nitto Denko Corporation); TE-9000, TE-7000, TE-8500 and DA-5000H (all four manufactured by Hitachi Chemical Co., Ltd.); and MO-3010 and MO-T010 (both manufactured by Lintec Corporation). Examples of the commercially available OCR material capable of forming transparent adhesive thin layer (III) include XV-SV-B1 and XV-7811 (both manufactured by Panasonic Corporation); and UVP-1003, UVP-1100, UVP-7100 and UVP-7000 (all four manufactured by Toagosei Co., Ltd.). Examples of the commercially available multifunctional film having a transparent adhesive which can be used as transparent adhesive thin layer (III) include HA-110, HA-115, HA-116 and HA-203 (all four manufactured by Lintec Corporation), widely used as a shatterproof film; and HC1100F-BP and HC2120E-BP (both manufactured by DIC Corporation).

In an embodiment of the present invention, a substrate including a region where thin layers are laminated on a transparent ground substrate, which thin layers are, in the order mentioned from the upper surface of the substrate, an ITO thin layer (I), an organic thin layer (II) and a transparent adhesive thin layer (III), refers to a substrate including, in its cross section thereof, a region where these thin layers are laminated, in the order mentioned from the upper surface of the substrate, the ITO thin layer (I), the organic thin layer (II) and the transparent adhesive thin layer (III). In other words, the above mentioned substrate includes (in the cross section thereof) at least one such a region.

The substrate according to the present invention may include a region in which a transparent insulating layer and/or wiring are formed, in addition to the region where thin layers are laminated in the order mentioned from the upper surface of the substrate, an ITO thin layer (I), an organic thin layer (II) and a transparent adhesive thin layer (III). Specifically, as shown in FIG. 2, the substrate may include a region in which a transparent insulating layer and/or wiring are formed between the ITO thin layer (I) and the organic thin layer (II). The substrate having a structure as shown in FIG. 2 can be used in a capacitive type touch panel.

Examples of the application of the substrate of the present invention include touch panels such as resistive type touch panels and capacitive type touch panels, and TFT substrates. However, the substrate of the present invention is preferably used in a capacitive type touch panel, more preferably, in a cover glass integrated-capacitive type touch panel. Since a touch panel produced using the substrate of the present invention has a reduced ITO pattern visibility, it is possible to improve the appearance of the terminal including the touch panel.

EXAMPLES

The present invention will now be described in detail with reference to the following Examples and Comparative Examples. However, the embodiments of the present invention are not limited thereto.

Synthesis Example 1

Synthesis of Hydroxyl Group-Containing Diamine Compound

A quantity of 18.3 g (0.05 mol) of 2,2-bis(3-amino-4-hydroxyphenyl)hexafluoropropane (hereinafter, referred to as "BAHF"; manufactured by Central Glass Co., Ltd.) was dissolved in 100 mL of acetone and 17.4 g (0.3 mol) of propylene oxide (manufactured by Tokyo Chemical Industry Co., Ltd.), followed by cooling to −15° C. To the resultant, a solution obtained by dissolving 20.4 g (0.11 mol) of 3-nitrobenzoyl chloride (manufactured by Tokyo Chemical Industry Co., Ltd.) in 100 mL of acetone was added dropwise. After the completion of the dropwise addition, the resultant was stirred for 4 hours at −15° C., and then the temperature was elevated to room temperature. The deposited white solids were separated by filtration, and vacuum dried at 50° C.

A quantity of 30 g of the resulting white solids was placed in a 300 mL stainless steel autoclave. The solids were then dispersed in 250 mL of methyl cellosolve, and followed by addition of 2 g of 5% palladium-carbon (manufactured by Wako Pure Chemical Industries, Ltd.). To the resultant, hydrogen was introduced by a balloon, followed by a reduction reaction at room temperature. After approximately 2 hours, it was confirmed that the balloon was no longer shriveling, and the reaction was terminated. After the completion of the reaction, the palladium compound as a catalyst was filtered off, and the resultant was concentrated using a rotatory evaporator to obtain a hydroxyl group-containing diamine compound represented by the formula below.

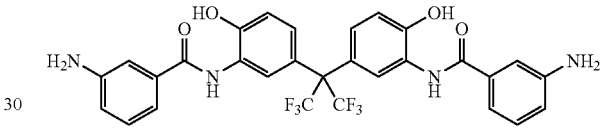

Synthesis Example 2

Synthesis of Polyimide (P1)

Under a dry nitrogen air flow, 16.5 g (0.045 mol) of BAHF was dissolved in 250 g of N-methyl-2-pyrrolidone (hereinafter, referred to as "NMP"). To the resultant, 15.5 g (0.05 mol) of 3,3',4,4'-diphenyl ether tetracarboxylic dianhydride (hereinafter, referred to as "ODPA"; manufactured by Manac Incorporated.) was added together with 50 g of NMP, followed by stirring at 30° C. for 2 hours. Then 1.09 g (0.01 mol) of 3-aminophenol (manufactured by Tokyo Chemical Industry Co., Ltd.) was added, and the stirring was continued at 40° C. for 2 hours. Further, 2.5 g of pyridine (manufactured by Tokyo Chemical Industry Co., Ltd.) was diluted in 15 g of toluene (manufactured by Tokyo Chemical Industry Co., Ltd.), and the resultant was added to the solution. Then a cooling pipe was attached, and while removing water and toluene out of the system by azeotropic distillation, the solution was reacted for 2 hours, with the solution temperature elevated to 120° C., and reacted for another 2 hours at 180° C. The temperature of the solution was then cooled to room temperature, and the solution was poured into 2 L of water. Then the precipitated polymer solids were collected by filtration. The collected polymer solids were washed 3 times with 2 L of water, and dried in a vacuum dryer at 50° C. for 72 hours to obtain polyimide (P1).

Synthesis Example 3

Synthesis of Polyimide Precursor (P2)

Under a dry nitrogen air flow, 25.7 g (0.043 mol) of the hydroxyl group-containing diamine compound obtained in Synthesis Example 1 and 0.62 g (0.0025 mol) of 1,3-bis(3-aminopropyl)tetramethyldisiloxane (hereinafter, referred to as "SiDA") was dissolved in 200 g of NMP. To the resultant, 15.5 g (0.05 mol) of ODPA was added together with 50 g of NMP, followed by stirring for 2 hours at 40° C. Then 1.09 g (0.01 mol) of 3-aminophenol (manufactured by Tokyo Chemical Industry Co., Ltd.) was added, followed by stirring for 2 hours at 40° C. Further, a solution obtained by diluting 3.57 g (0.03 mol) of dimethylformamide dimethyl acetal (hereinafter, referred to as "DFA"; manufactured by Mitsubishi Rayon Co., Ltd.) with 5 g of NMP was added dropwise over 10 minutes. After the dropwise addition, the stirring was continued for 2 hours at 40° C. After the completion of the stirring, the solution was poured into 2 L of water, and the precipitated polymer solids were collected by filtration. The collected polymer solids were washed 3 times with 2 L of water, and dried in a vacuum dryer at 50° C. for 72 hours to obtain polyimide precursor (P2). The Mw of polyimide precursor (P2) was 30,000.

Synthesis Example 4

Synthesis of Polybenzoxazole Precursor (P3)

Under a dry nitrogen air flow, 16.5 g (0.045 mol) of BAHF was dissolved in 50 g of NMP and 26.4 g of glycidyl methyl ether, and the temperature of the solution was lowered to −15° C. To the resultant, a solution obtained by dissolving 7.4 g (0.025 mol) of diphenyl ether dicarboxylic acid dichloride (manufactured by Nihon Nohyaku Co., Ltd.) and 5.1 g (0.025 mol) of isophthalic acid dichloride (manufactured by Tokyo Chemical Industry Co., Ltd.) in 25 g of GBL was added dropwise such that the internal temperature did not exceed 0° C. After the completion of the dropwise addition, the stirring was continued for 6 hours at −15° C. After the reaction was completed, the solution was poured into 2 L of water containing 10% by weight of methanol, and the precipitated polymer solids were collected by filtration. The collected polymer solids were washed 3 times with 2 L of water, and dried in a vacuum dryer at 50° C. for 72 hours to obtain a polyhydroxyamide resin.

A quantity of 20 g of the resulting polyhydroxyamide resin was dissolved in 80 g of NMP, and 0.58 g (0.0035 mol) of 2-amino-4-tert-butylphenol was added to the resultant, followed by stirring at room temperature for 2 hours. After the completion of the stirring, the solution was poured into 2 L of water, and the precipitated polymer solids were collected by filtration. The collected polymer solids were washed 3 times with 2 L of water, and dried in a vacuum dryer at 50° C. for 72 hours to obtain polybenzoxazole precursor (P3).

Synthesis Example 5

Synthesis of Polyamideimide Precursor (P4)

Under a nitrogen-substituted atmosphere, 19.22 g (96.0 mmol) of 4,4'-diaminodiphenyl ether (manufactured by Wakayama Seika Kogyo Co., Ltd.), 0.99 g (4.0 mmol) of SiDA and 10.1 g (100.0 mmol) of triethylamine (manufactured by Tokyo Chemical Industry Co., Ltd.) were dissolved in 200 g of NMP. To the resultant, 20.63 g (98.0 mmol) of trimellitic anhydride chloride dissolved in 80 g of NMP was added dropwise. After the completion of the dropwise addition, the temperature of the solution was adjusted to 30° C., followed by stirring for 4 hours to allow the reaction to proceed. The resulting polymerization solution was poured into 2 L of ion exchanged water and separated by filtration, and the resultant was washed again with pure water, to obtain a powder of polyamideimide precursor (P4).

Synthesis Example 6

Synthesis of Acrylic Resin Solution (P5)

To a 500 mL flask, 1 g of 2,2'-azobis(isobutyronitrile) and 50 g of propylene glycol methyl ether acetate (hereinafter, referred to as "PGMEA") were charged. Then 26.5 g of methacrylic acid, 21.3 g of styrene and 37.7 g of tricyclo[5.2.1.02,6]decan-8-yl methacrylate were charged. After stirring the resultant at room temperature for a while, interior of the flask was sufficiently replaced with nitrogen by bubbling, followed by stirring for 5 hours at 70° C. To the resulting solution, 14.6 g of glycidyl methacrylate, 1 g of dimethylbenzylamine, 0.2 g of p-methoxyphenol and 100 g of PGMEA were added, followed by stirring for 4 hours at 90° C. After the completion of the reaction, the reaction solution was subjected to separating extraction with 1N formic acid aqueous solution in order to remove the addition catalyst, dried over magnesium sulfate, and PGMEA was added to a solids concentration of 40 wt %, to obtain acrylic resin solution (P5). The Mw of the obtained acrylic resin solution (P5) was 30,000.

Synthesis Example 7

Synthesis of Polysiloxane Solution (P6)

To a 500 mL flask, 47.67 g (0.35 mol) of methyltrimethoxysilyl, 39.66 g (0.20 mol) of phenyltrimethoxysilane, 82.04 g (0.35 mol) of γ-acryloylpropyltrimethoxysilane, 26.23 (0.1 mol) of 3-trimethoxysilylpropyl succinic anhydride and 195.6 g of diacetone alcohol (hereinafter, referred to as "DAA") were charged. To the resultant, an aqueous phosphoric acid solution obtained by dissolving 0.39 g of phosphoric acid (0.2 parts by weight relative to the charged monomer) in 55.8 g of water (the stoichiometric amount required for hydrolysis) was added dropwise using a dropping funnel over 10 minutes, while stirring in an oil bath controlled at 40° C. After stirring the resultant for 1 hour at 40° C., the temperature of the oil bath was controlled to 70° C. and stirred for 1 hour, and then the temperature of the oil bath was elevated to 115° C. over 30 minutes. One hour after the start of the temperature elevation, the internal temperature of the solution reached 100° C., and the solution was heated while stirring for another 2 hours (the internal temperature was from 100 to 110° C.). During the reaction, methanol and water, as by-products, were distilled out in a total amount of 127 g. To the resulting solution of polysiloxane in DAA, DAA was added to a polymer concentration of 40 wt %, to obtain polysiloxane solution (P6). The Mw of the obtained polymer as measured by GPC was 4,500 (in terms of polystyrene).

Synthesis Example 8

Synthesis of Polyester Resin Solution (P7)

A quantity of 148 g of 1,1-bis(4-(2,3-epoxypropyloxyl)phenyl)-3-phenylindan, 47 g of acrylic acid, 1 g of tetrabutylammonium acetate (hereinafter, referred to as "TBAA"), 2.0 g of tert-butylcatechol and 244 g of PGMEA were charged, and the resultant was stirred for 5 hours at 120° C.

After cooling the resultant to room temperature, 30 g of biphenyltetracarboxylic dianhydride and 1 g of TBAA were added, followed by stirring for 3 hours at 110° C. After cooling the resultant to room temperature, 15 g of tetrahydrophthalic anhydride was added, followed by stirring for 5 hours at 120° C. After the completion of the reaction, 500 g of PGMEA was added, and the reaction solution was subjected to separating extraction with 1N formic acid aqueous solution in order to remove the catalyst for addition, dried over magnesium sulfate, concentrated using a rotatory evaporator to achieve a solids concentration of 40 wt %, to obtain polyester resin P7 (Mw=5,000).

Preparation Example 1

Preparation of Resin Composition (H1)

Under yellow light, 1.364 g of zirconia dispersion (1) (a dispersion liquid of dipentaerythritol hexaacrylate/zirconia=3/7 (weight ratio) in PGMEA; zirconia content=35 wt %), 0.0382 g of Irgacure OXE-02 (manufactured by BASF Japan Ltd.; ethanone, 1-[9-ethyl-6-(2-methylbenzoyl)-9H-carbazol-3-yl]-1-(0-acetyloxime)) and 0.0048 g of hydroquinone methyl ether (hereinafter, referred to as "HQME") were added, and dissolved in 9.50 g of tetrahydrofurfuryl alcohol (hereinafter, referred to as "THFA") and 8.23 g of PGMEA, followed by stirring. To the resultant, 0.068 g of a 50 wt % solution of "KAYARAD (registered trademark)" DPHA (dipentaerythritol hexaacrylate; manufactured by NIPPON KAYAKU CO., LTD) in PGMEA, 0.597 g of acrylic resin solution (P5), and 0.2000 g of a 1 wt % solution of "BYK-333 (silicone surfactant; manufactured by BYK-Chemie Japan K. K.), which is a silicone surfactant, in PGMEA (corresponding to concentration of 100 ppm) were added individually, followed by stirring. Filtration was then carried out using a 0.45 μm filter to obtain negative-tone photosensitive resin composition (H1).

Preparation Example 2

Preparation of Resin Composition (H2)

Under yellow light, 1.364 g of zirconia dispersion (1), 0.0382 g of Irgacure OXE-02 and 0.0048 g of HQME were added, and dissolved in 9.50 g of THFA and 8.347 g of PGMEA, followed by stirring. To the resultant, 0.0682 g of a 50 wt % solution of DPHA in PGMEA, 0.478 g of CR-TR5 (a 50 wt % solution of alkali-soluble cardo type resin in PGMEA; manufactured by Osaka Gas Chemicals Co., Ltd.), and 0.2000 g of a 1 wt % BYK-333 solution in PGMEA were added individually, followed by stirring. Filtration was then carried out using a 0.45 filter, to obtain negative-tone photosensitive resin composition (H2).

Preparation Example 3

Preparation of Resin Composition (H3)

The same operation as in Preparation Example 2 was carried out except that polyester resin (P7) was used instead of CR-TR5, to obtain negative-tone photosensitive resin composition (H3).

Preparation Example 4

Preparation of Resin Composition (H4)

Under yellow light, 1.364 g of zirconia dispersion (2) (dispersion liquid of vinyltrimethoxysilane/2-methacryloxyethyl isocyanate/zirconia=1/1/10 (weight ratio) in methyl ethyl ketone (hereinafter, referred to as "MEK"); zirconia content=30 wt %), 0.0382 g of Irgacure OXE-02 and 0.0048 g of HQME were added, and dissolved in 9.50 g of THFA and 8.347 g of PGMEA, followed by stirring. To the resultant, 0.0682 g of a 50 wt % solution of DPHA in PGMEA, 0.478 g of CR-TR5, and 0.2000 g of a 1 wt % solution of BYK-333 in PGMEA were added individually, followed by stirring. Filtration was then carried out using a 0.45 μm filter, to obtain negative-tone photosensitive resin composition (144).

Preparation Example 5

Preparation of Resin Composition (H5)

The same operation as in Preparation Example 4 was carried out except that polyester resin (P7) was used instead of CR-TR5, to obtain negative-tone photosensitive resin composition (H5).

Preparation Example 6

Preparation of Resin Composition (H6)

The same operation as in Preparation Example 4 was carried out except that "SZR-K" (zirconia MEK dispersion liquid; zirconia content=30 wt %; manufactured by Sakai Chemical Industry Co., Ltd.) was used instead of zirconia dispersion (2), to obtain negative-tone photosensitive resin composition (H6).

Preparation Example 7

Preparation of Resin Composition (H7)

The same operation as in Preparation Example 5 was carried out except that "SZR-K" was used instead of zirconia dispersion (2), to obtain negative-tone photosensitive resin composition (H7).

Preparation Example 8

Preparation of Resin Composition (H8)

Under yellow light, 1.592 g of TR-513 (dispersion liquid of titanium dioxide in γ-butyrolactone; solids concentration=30 wt %; manufactured by JGC C&C), 0.0382 g of Irgacure OXE-02 and 0.0048 g of HQME were added, and dissolved in 9.14 g of DAA and 7.95 g of γ-butyrolactone (hereinafter, referred to as "GBL"), followed by stirring. To the resultant, 0.478 g of a 50 wt % solution of DPHA in PGMEA, 0.597 g of siloxane solution (P6), and 0.2000 g of a 1 wt % solution of BYK-333 in PGMEA were added individually, followed by stirring. Filtration was then carried out using a 0.45 μm filter, to obtain negative-tone photosensitive resin composition (H8).

Preparation Example 9

Preparation of Resin Composition (H9)

Under yellow light, 1.663 g of TR-513, 5.70 g of ethyl lactate (hereinafter, referred to as "EL") and 11.94 g of GBL were added, followed by stirring. To the mixture, 0.150 g of TP5-280M (manufactured by Toyo Gosei Co., Ltd.; 5-naphthoquinonediazide sulfonic acid ester compound of TrisP- PA (manufactured by Honshu Chemical Industry Co., Ltd.)), 0.349 g of polyimide precursor (P2), and 0.2000 g of a 1 wt % solution of BYK-333 in PGMEA were added individually, and the resultant was stirred until dissolved. Filtration was then carried out using a 0.45 μm filter, to obtain positive-tone photosensitive resin composition (H9).

Preparation Example 10

Preparation of Resin Composition (H10)

Under yellow light, 1.996 g of TR-513, 5.70 g of EL, and 11.70 g of GBL were added, followed by stirring. To the mixture, 0.150 g of TP5-280M, 0.250 g of polyimide precursor (P2), and 0.2000 g of a 1 wt % BYK-333 solution in PGMEA were added individually, and the resultant was stirred until dissolved. Filtration was then carried out using a 0.45 μm filter, to obtain positive-tone photosensitive resin composition (H10).

Preparation Example 11

Preparation of Resin Composition (H11)

Under yellow light, 0.0382 g of Irgacure OXE-02 and 0.0048 g of HQME were added, and dissolved in 9.50 g of THFA and 8.35 g of PGMEA, followed by stirring. To the resultant, 0.287 g of EA-0250P (a 50 wt % solution of 9,9-bis[4-(2-acryloyloxyethoxy)phenyl]fluorene in PGMEA; solids concentration=50 wt %; manufactured by Osaka Gas Chemicals Co., Ltd.), 0.669 g of a 50 wt % solution of DPHA in PGMEA, 0.995 g of CR-TR5, and 0.2000 g of a 1 wt % solution of BYK-333 in PGMEA were added individually, followed by stirring. Filtration was then carried out using a 0.45 μm filter, to obtain negative-tone photosensitive resin composition (H11).

Preparation Example 12

Preparation of Resin Composition (H12)

Under yellow light, 0.0382 g of Irgacure OXE-02, 0.0048 g of HQME and 0.478 g of polyimide (P1) were added, and dissolved in 9.50 g of GBL and 8.35 g of PGMEA, followed by stirring. To the resultant, 0.287 g of EA-0250P, 0.669 g of a 50 wt % solution of DPHA in PGMEA, and 0.2000 g of a 1 wt % solution of BYK-333 in PGMEA were added individually, followed by stirring. Filtration was then carried out using a 0.45 μm filter, to obtain negative-tone photosensitive resin composition (H12).

Preparation Example 13

Preparation of Resin Composition (H13)

Under yellow light, 0.150 g of TP5-280M, 0.843 g of polyimide (P1), 5.70 g of EL, 13.10 g of GBL, and 0.2000 g of a 1 wt % solution of BYK-333 in PGMEA were added individually, and the resultant was stirred until dissolved. Filtration was then carried out using a 0.45 μm filter, to obtain positive-tone photosensitive resin composition (H13).

Preparation Example 14

Preparation of Resin Composition (H14)

The same operation as in Preparation Example 13 was carried out except that polyimide, precursor (P2) was used instead of polyimide (P1), to obtain positive-tone photosensitive resin composition (H14).

Preparation Example 15

Preparation of Resin Composition (H15)

The same operation as in Preparation Example 13 was carried out except that polybenzoxazole precursor (P3) was used instead of polyimide (P1), to obtain positive-tone photosensitive resin composition (H15).

Preparation Example 16

Preparation of Resin Composition (H16)

The same operation as in Preparation Example 13 was carried out except that polyamideimide precursor (P4) was used instead of polyimide (P1), to obtain positive-tone photosensitive resin composition (H16).

Preparation Example 17

Preparation of Resin Composition (H17)

The same operation as in Preparation Example 13 was carried out except that CR-TR5 was used instead of polyimide (P1), to obtain positive-tone photosensitive resin composition (H17).

Preparation Example 18

Preparation of Resin Composition (H18)

The same operation as in Preparation Example 13 was carried out except that polyester resin (P7) was used instead of polyimide (P1), to obtain positive-tone photosensitive resin composition (H18).

Preparation Example 19

Preparation of Resin Composition (H19)

A quantity of 0.998 g of polyimide precursor (P2), 5.70 g of EL, 13.10 g of GBL, and 0.2000 g of a 1 wt % solution of BYK-333 in PGMEA were added individually, and the resultant was stirred until dissolved. Filtration was then carried out using a 0.45 μm filter, to obtain non-photosensitive resin composition (H19).

Preparation Example 20

Preparation of Resin Composition (H20)

The same operation as in Preparation Example 19 was carried out except that polybenzoxazole precursor (P3) was used instead of polyimide precursor (P2), to obtain non-photosensitive resin composition (H20).

Preparation Example 21

Preparation of Resin Composition (H21)

The same operation as in Preparation Example 19 was carried out except that polyamideimide precursor (P4) was used instead of polyimide precursor (P2), to obtain non-photosensitive resin composition (H21).

Preparation Example 22

Preparation of Resin Composition (H22)

The same operation as in Preparation Example 19 was carried out except that polyester resin (P7) was used instead of polyimide precursor (P2), to obtain non-photosensitive resin composition (H22).

Preparation Example 23

Preparation of Resin Composition (H23)

The same operation as in Preparation Example 19 was carried out except that a polyethersulfone "SUMIKAEXCEL 3600P" (manufactured by Sumitomo Chemical Co., Ltd.) was used instead of polyimide precursor (P2), to obtain non-photosensitive resin composition (H23).

Preparation Example 24

Preparation of Resin Composition (H24)

The same operation as in Preparation Example 19 was carried out except that a phenol resin "Resitop PSF-2808" (manufactured by Gunei Chemical Industry Co., Ltd.) was used instead of polyimide precursor (P2), to obtain non-photosensitive resin composition (H24).

Preparation Example 25

Preparation of Resin Composition (H25)

A quantity of 0.5 g of 9,9-bis[4-(2-glycidyloxyethoxy)phenyl]fluorene (EG-200; manufactured by Osaka Gas Chemicals Co., Ltd.) was dissolved in 9.300 g of PGMEA, and 0.02 g of SI-200 (thermal acid generator; manufactured by Sanshin Chemical Industry Co., Ltd.) and 0.200 g of a 1 wt % solution of BYK-333 in PGMEA were added individually, followed by stirring. Filtration was then carried out using a 0.45 μm filter, to obtain non-photosensitive resin composition (H25).

Preparation Example 26

Preparation of Resin Composition (H26)

Under yellow light, 8.200 g of zirconia dispersion (1), 0.2296 g of Irgacure OXE-02 and 0.0048 g of HQME were added, and dissolved in 7.00 g of THFA and 1.062 g of PGMEA, followed by stirring. To the resultant, 0.4100 g of a 50 wt % solution of DPHA in PGMEA, 2.870 g of CR-TR5, and 0.2000 g of a 1 wt % solution of BYK-333 in PGMEA were added individually, followed by stirring. Filtration was then carried out using a 0.45 μm filter, to obtain negative-tone photosensitive resin composition (H26).

Preparation Example 27

Preparation of Resin Composition (H27)

Under yellow light, 2.162 g of TR-513, 5.70 g of EL and 11.59 g of GBL were added, followed by stirring. To the mixture, 0.099 g of TP5-280M, 0.249 g of polyimide precursor (P2) and 0.2000 g of a 1 wt % solution of BYK-333 in PGMEA were added individually, and the resultant was stirred until dissolved. Filtration was then carried out using a 0.45 μm filter, to obtain positive-tone photosensitive resin composition (H27).

Preparation Example 28

Preparation of Resin Composition (M1)

Under yellow light, 0.0382 g of Irgacure OXE-02 and 0.0048 g of HQME were added, and dissolved in 9.50 g of GBL and 8.10 g of PGMEA, followed by stirring. To the resultant, 0.955 g of a 50 wt % solution of DPHA in PGMEA, 1.194 g of acrylic resin solution (P5), and 0.2000 g of a 1 wt % solution of BYK-333 in PGMEA were added individually, followed by stirring. Filtration was then carried out using a 0.45 μm filter, to obtain negative-tone photosensitive resin composition (M1).

The compositions of the resin compositions obtained in Preparation Examples 1 to 28 are shown in Table 1.

TABLE 1-1

| | Resin Composition | | Resin Component | Metal Oxide Particles | Photosensitive Components | Other Additives | Solids Concentration |
|---|---|---|---|---|---|---|---|
| Preparation Example 1 | H1 | P5 (25) | Acrylic resin | Zirconia dispersion [1] (50) | OXE-02 (4), DPHA (25) | BYK-333 ($2.1 \times 10^{-3}$) | 5% |
| Preparation Example 2 | H2 | CR-TR5 (25) | Cardo type resin | Zirconia dispersion [1] (50) | OXE-02 (4), DPHA (25) | BYK-333 ($2.1 \times 10^{-3}$) | 5% |
| Preparation Example 3 | H3 | P7 (25) | Polyester | Zirconia dispersion [1] (50) | OXE-02 (4), DPHA (25) | BYK-333 ($2.1 \times 10^{-3}$) | 5% |
| Preparation Example 4 | H4 | CR-TR5 (25) | Cardo type resin | Zirconia dispersion [2] (50) | OXE-02 (4), DPHA (25) | BYK-333 ($2.1 \times 10^{-3}$) | 5% |
| Preparation Example 5 | H5 | P7 (25) | Polyester | Zirconia dispersion [2] (50) | OXE-02 (4), DPHA (25) | BYK-333 ($2.1 \times 10^{-3}$) | 5% |
| Preparation Example 6 | H6 | CR-TR5 (25) | Cardo type resin | SZR-K (50) | OXE-02 (4), DPHA (25) | BYK-333 ($2.1 \times 10^{-3}$) | 5% |
| Preparation Example 7 | H7 | P7 (25) | Polyester | SZR-K (50) | OXE-02 (4), DPHA (25) | BYK-333 ($2.1 \times 10^{-3}$) | 5% |
| Preparation Example 8 | H8 | P6 (25) | Siloxane | TR-513 (50) | OXE-02 (4), DPHA (25) | BYK-333 ($2.1 \times 10^{-3}$) | 5% |

TABLE 1-1-continued

| | Resin Composition | Resin Component | | Metal Oxide Particles | Photosensitive Components | Other Additives | Solids Concentration |
|---|---|---|---|---|---|---|---|
| Preparation Example 9 | H9 | P2 (35) | Polyimide precursor | TR-513 (50) | TP5-280M (15) | BYK-333 ($2.1 \times 10^{-3}$) | 5% |
| Preparation Example 10 | H10 | P2 (25) | Polyimide precursor | TR-513 (60) | TP5-280M (15) | BYK-333 ($2.1 \times 10^{-3}$) | 5% |
| Preparation Example 11 | H11 | CR-TR5 (50) | Cardo type resin | — | OXE-02 (4), DPHA (35), EA-0250P (15) | BYK-333 ($2.1 \times 10^{-3}$) | 5% |
| Preparation Example 12 | H12 | P1 (50) | Polyimide | — | OXE-02 (4), DPHA (35), EA-0250P (15) | BYK-333 ($2.1 \times 10^{-3}$) | 5% |
| Preparation Example 13 | H13 | P1 (100) | Polyimide | — | TP5-280M (15) | BYK-333 ($2.1 \times 10^{-3}$) | 5% |
| Preparation Example 14 | H14 | P2 (100) | Polyimide precursor | — | TP5-280M (15) | BYK-333 ($2.1 \times 10^{-3}$) | 5% |

TABLE 1-2

| | Resin Composition | Resin Component | | Metal Oxide Particles | Photosensitive Components | Other Additives | Solids Concentration |
|---|---|---|---|---|---|---|---|
| Preparation Example 15 | H15 | P3 (100) | Polybenzoxazole | — | TP5-280M (15) | BYK-333 ($2.1 \times 10^{-3}$) | 5% |
| Preparation Example 16 | H16 | P4 (100) | Polyamideimide precursor | — | TP5-280M (15) | BYK-333 ($2.1 \times 10^{-3}$) | 5% |
| Preparation Example 17 | H17 | CR-TR5 (100) | Cardo type resin | — | TP5-280M (15) | BYK-333 ($2.1 \times 10^{-3}$) | 5% |
| Preparation Example 18 | H18 | P7 (100) | Polyester | — | TP5-280M (15) | BYK-333 ($2.1 \times 10^{-3}$) | 5% |
| Preparation Example 19 | H19 | P2 (100) | Polyimide precursor | — | — | BYK-333 ($2.1 \times 10^{-3}$) | 5% |
| Preparation Example 20 | H20 | P3 (100) | Polybenzoxazole | — | — | BYK-333 ($2.1 \times 10^{-3}$) | 5% |
| Preparation Example 21 | H21 | P4 (100) | Polyamideimide precursor | — | — | BYK-333 ($2.1 \times 10^{-3}$) | 5% |
| Preparation Example 22 | H22 | P7 (100) | Polyester | — | — | BYK-333 ($2.1 \times 10^{-3}$) | 5% |
| Preparation Example 23 | H23 | 3600P (100) | Polyethersulfone | — | — | BYK-333 ($2.1 \times 10^{-3}$) | 5% |
| Preparation Example 24 | H24 | PSF-2808 (100) | Phenol resin | — | — | BYK-333 ($2.1 \times 10^{-3}$) | 5% |
| Preparation Example 25 | H25 | EG-200 (100) | Cardo type resin | — | — | BYK-333 ($2.1 \times 10^{-3}$), SI-200 (2) | 5% |
| Preparation Example 26 | H26 | CR-TR5 (25) | Cardo type resin | Zirconia dispersion [1] (50) | OXE-02 (4), DPHA (25) | BYK-333 ($2.1 \times 10^{-3}$) | 30% |
| Preparation Example 27 | H27 | P2 (25) | Polyimide precursor | TR-513 (65) | TP5-280M (10) | BYK-333 ($2.1 \times 10^{-3}$) | 5% |
| Preparation Example 28 | M1 | P5 (50) | Acrylic resin | — | OXE-02 (4), DPHA (50) | BYK-333 ($2.1 \times 10^{-3}$) | 5% |

In Table 1, numerical values in parentheses represent the added amounts (parts by weight) of the components. It should be noted, however, that when the components are diluted by solvents or the like, the numerical values in parentheses represent the amounts of solid components (parts by weight).

The "Solids Concentration" shown in Table 1 refers to the ratio in weight concentration (wt %) of "the total weight of the solid components (in other words, the weight excluding that of the solvent) of all the raw materials added in each of the Preparation Examples" to the "the weight of the resin composition (in other words, the weight including that of the solvent) obtained in each of the Preparation Examples".

The evaluation methods for each of Examples and Comparative Examples are shown below. The constitutions and the results of Examples 1 to 39 and Comparative Examples 1 to 4 are shown in Table 2.

TABLE 2-1

|  | Substrate | (I) ITO Film Thickness (nm) | (II) Resin Composition | (II) Refractive Index | (II) Film Thickness (μm) | (III) Refractive Index |
|---|---|---|---|---|---|---|
| Example 1 | Chemically tempered glass | 50 | H1 | 1.60 | 0.10 | 1.47 |
| Example 2 | Chemically tempered glass | 50 | H2 | 1.66 | 0.10 | 1.47 |
| Example 3 | Chemically tempered glass | 50 | H3 | 1.65 | 0.10 | 1.47 |
| Example 4 | Chemically tempered glass | 50 | H4 | 1.66 | 0.10 | 1.47 |
| Example 5 | Chemically tempered glass | 50 | H5 | 1.65 | 0.10 | 1.47 |
| Example 6 | Chemically tempered glass | 50 | H6 | 1.66 | 0.10 | 1.47 |
| Example 7 | Chemically tempered glass | 50 | H7 | 1.65 | 0.10 | 1.47 |
| Example 8 | Chemically tempered glass | 50 | H8 | 1.65 | 0.10 | 1.47 |
| Example 9 | Chemically tempered glass | 50 | H9 | 1.78 | 0.10 | 1.47 |
| Example 10 | Chemically tempered glass | 50 | H10 | 1.84 | 0.10 | 1.47 |
| Example 11 | Chemically tempered glass | 50 | H11 | 1.59 | 0.10 | 1.47 |
| Example 12 | Chemically tempered glass | 50 | H12 | 1.59 | 0.10 | 1.47 |
| Example 13 | Chemically tempered glass | 50 | H13 | 1.63 | 0.10 | 1.47 |
| Example 14 | Chemically tempered glass | 50 | H14 | 1.63 | 0.10 | 1.47 |
| Example 15 | Chemically tempered glass | 50 | H15 | 1.65 | 0.10 | 1.47 |
| Example 16 | Chemically tempered glass | 50 | H16 | 1.65 | 0.10 | 1.47 |
| Example 17 | Chemically tempered glass | 50 | H17 | 1.63 | 0.10 | 1.47 |
| Example 18 | Chemically tempered glass | 50 | H18 | 1.61 | 0.10 | 1.47 |
| Example 19 | Chemically tempered glass | 50 | H19 | 1.63 | 0.10 | 1.47 |
| Example 20 | Chemically tempered glass | 50 | H20 | 1.65 | 0.10 | 1.47 |
| Example 21 | Chemically tempered glass | 50 | H21 | 1.65 | 0.10 | 1.47 |
| Example 22 | Chemically tempered glass | 50 | H22 | 1.61 | 0.10 | 1.47 |
| Example 23 | Chemically tempered glass | 50 | H23 | 1.65 | 0.10 | 1.47 |
| Example 24 | Chemically tempered glass | 50 | H24 | 1.65 | 0.10 | 1.47 |
| Example 25 | Chemically tempered glass | 50 | H25 | 1.62 | 0.10 | 1.47 |
| Example 26 | PET | 50 | H2 | 1.66 | 0.10 | 1.47 |
| Example 27 | PET | 50 | H7 | 1.65 | 0.10 | 1.47 |
| Example 28 | Chemically tempered glass | 50 | H2 | 1.66 | 0.05 | 1.47 |
| Example 29 | Chemically tempered glass | 50 | H7 | 1.65 | 0.05 | 1.47 |
| Example 30 | Chemically tempered glass | 50 | H2 | 1.66 | 0.25 | 1.47 |
| Example 31 | Chemically tempered glass | 50 | H7 | 1.65 | 0.25 | 1.47 |
| Example 32 | Chemically tempered glass | 50 | H2 | 1.66 | 0.35 | 1.47 |
| Example 33 | Chemically tempered glass | 50 | H7 | 1.65 | 0.35 | 1.47 |
| Example 34 | Chemically tempered glass | 100 | H2 | 1.66 | 0.10 | 1.47 |
| Example 35 | Chemically tempered glass | 100 | H7 | 1.65 | 0.10 | 1.47 |
| Example 36 | Chemically tempered glass | 150 | H2 | 1.66 | 0.10 | 1.47 |
| Example 37 | Chemically tempered glass | 150 | H7 | 1.65 | 0.10 | 1.47 |
| Example 38 | Chemically tempered glass | 50 | H2 | 1.66 | 0.10 | 1.50 |
| Example 39 | Chemically tempered glass | 50 | H7 | 1.65 | 0.10 | 1.50 |
| Comparative Example 1 | Chemically tempered glass | 50 |  |  |  | 1.47 |
| Comparative Example 2 | Chemically tempered glass | 50 | H26 | 1.66 | 0.50 | 1.47 |
| Comparative Example 3 | Chemically tempered glass | 50 | M1 | 1.52 | 0.10 | 1.47 |
| Comparative Example 4 | Chemically tempered glass | 50 | H27 | 1.88 | 0.10 | 1.47 |

TABLE 2-2

| | Substrate | ITO Pattern Visibility | Adhesive Strength Evaluation Result |
|---|---|---|---|
| Example 1 | Chemically tempered glass | 8 | 2 |
| Example 2 | Chemically tempered glass | 10 | 3 |
| Example 3 | Chemically tempered glass | 10 | 3 |
| Example 4 | Chemically tempered glass | 10 | 3 |
| Example 5 | Chemically tempered glass | 10 | 3 |
| Example 6 | Chemically tempered glass | 10 | 3 |
| Example 7 | Chemically tempered glass | 10 | 3 |
| Example 8 | Chemically tempered glass | 10 | 3 |
| Example 9 | Chemically tempered glass | 8 | 3 |
| Example 10 | Chemically tempered glass | 7 | 3 |
| Example 11 | Chemically tempered glass | 7 | 3 |
| Example 12 | Chemically tempered glass | 7 | 3 |
| Example 13 | Chemically tempered glass | 10 | 3 |
| Example 14 | Chemically tempered glass | 10 | 3 |
| Example 15 | Chemically tempered glass | 10 | 3 |
| Example 16 | Chemically tempered glass | 10 | 3 |
| Example 17 | Chemically tempered glass | 10 | 3 |
| Example 18 | Chemically tempered glass | 10 | 3 |
| Example 19 | Chemically tempered glass | 10 | 3 |
| Example 20 | Chemically tempered glass | 10 | 3 |
| Example 21 | Chemically tempered glass | 10 | 3 |
| Example 22 | Chemically tempered glass | 10 | 3 |
| Example 23 | Chemically tempered glass | 10 | 3 |
| Example 24 | Chemically tempered glass | 10 | 3 |
| Example 25 | Chemically tempered glass | 10 | 3 |
| Example 26 | PET | 10 | 3 |
| Example 27 | PET | 10 | 3 |
| Example 28 | Chemically tempered glass | 9 | 3 |
| Example 29 | Chemically tempered glass | 9 | 3 |
| Example 30 | Chemically tempered glass | 9 | 3 |
| Example 31 | Chemically tempered glass | 9 | 3 |
| Example 32 | Chemically tempered glass | 8 | 3 |
| Example 33 | Chemically tempered glass | 8 | 3 |
| Example 34 | Chemically tempered glass | 10 | 3 |
| Example 35 | Chemically tempered glass | 10 | 3 |
| Example 36 | Chemically tempered glass | 10 | 3 |
| Example 37 | Chemically tempered glass | 10 | 3 |
| Example 38 | Chemically tempered glass | 9 | 3 |
| Example 39 | Chemically tempered glass | 9 | 3 |
| Comparative Example 1 | Chemically tempered glass | 3 | |
| Comparative Example 2 | Chemically tempered glass | 5 | 3 |
| Comparative Example 3 | Chemically tempered glass | 3 | 2 |
| Comparative Example 4 | Chemically tempered glass | 5 | 3 |

Example 1

(1) Preparation of ITO Pattern

An ITO layer having a film thickness of 50 nm was formed by sputtering, on a 1.1 mm-thick, chemically tempered glass substrate, and then the resultant was spin coated with a positive-tone photoresist (OFPR-800; manufactured by Tokyo Ohka Kogyo., Ltd.) using a spin coater (1H-360S; manufactured by MIKASA CO., LTD.), followed by prebaking at 100° C. for 2 minutes using a hot plate (SCW-636; manufactured by Dainippon Screen Mfg. Co., Ltd.). The obtained prebaked layer was exposed to 1000 J/m² of light with a 100 μm gap through a mask, using a PLA (Parallel Light Aligner), and using an ultra-high pressure mercury lamp as a light source. The resultant was then subjected to shower development for 90 seconds with aqueous 2.38 wt tetramethylammonium hydroxide (hereinafter, referred to as "TMAH") solution, using an automatic developing machine (AD-2000; manufactured by Takizawa Co., Ltd.), rinsed with water for 30 seconds, and subjected to patterning. Then the ITO layer was etched with a HCl—HNO₃-based etchant, followed by removing the photoresist with a stripping solution, to prepare a glass substrate having ITO (reference numeral 2 in FIG. 1 and FIG. 2) with which parts of first electrodes and second electrodes perpendicular to the first electrodes were patterned (corresponding to "a" in FIG. 1).

(2) Preparation of Transparent Insulating Layer

A negative-tone photosensitive resin composition NS-E2000 (manufactured by Toray Industries, Inc.) was spin coated on the glass substrate obtained in (1), followed by prebaking at 90° C. for 2 minutes using a hot plate. The obtained prebaked layer was exposed to 2000 J/m² of light through a mask, with a 100 μm gap. Then the resultant was subjected to shower development with aqueous 0.4 wt % TMAH solution for 90 seconds, followed by rinsing with water for 30 seconds. The resultant was then cured in air at 230° C. for 1 hour to form a transparent insulating layer (reference numeral 3 in FIG. 1 and FIG. 2) having a film thickness of 1.5 μm (corresponding to "b" in FIG. 1).

(3) Preparation of Molybdenum/Aluminium/Molybdenum (MAM) Wiring

Figure 1:
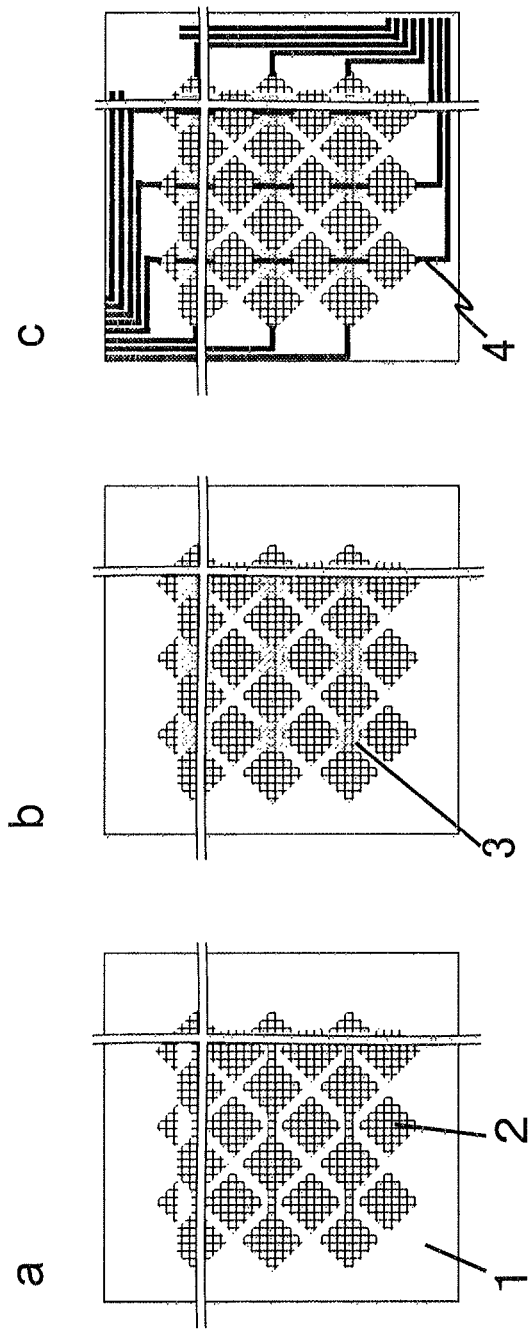
FIG. 1 is a schematic view showing the production process of the ITO pattern, transparent insulating layer and molybdenum/aluminium/molybdenum wiring.

The same procedure as in the above described (1) was carried out except that molybdenum and aluminium were used as targets on the glass substrate obtained in (2), and a mixed solution of $H_3PO_4/HNO_3/CH_3COOH/H_2O=65/3/5/27$ (weight ratio) was used as an etchant, to form MAM wiring (reference numeral 4 in FIG. 1 and FIG. 2) (corresponding to "c" in FIG. 1). The film thickness of MAM wiring was adjusted to 250 nm.

(4) Formation of Organic Thin Layer (II)

The glass substrate obtained in (3) was spin coated with the resin composition (H1) obtained in Preparation Example 1, followed by prebaking at 90° C. for 2 minutes using a hot plate. The obtained prebaked layer was exposed to 2000 J/m² of light through a mask, with a 100 μm gap. The resultant was then subjected to shower development with aqueous 0.4 wt % TMAH solution for 90 seconds, followed by rinsing with water for 30 seconds. The resultant was then cured in air at 230° C. for 1 hour to form a cured layer (reference numeral 5 in FIG. 2) having a film thickness of 0.10 μm, which corresponds to organic thin layer (II).

(5) Pasting of Film Having Transparent Adhesive Thin Layer (III)

A polyethylene terephthalate (hereinafter referred to as "PET") film "HA-116" (layer structure: transparent adhesive thin layer/PET film/hard coat layer; refractive index of the adhesive=1.47; film thickness of the transparent adhesive thin layer (III)=50 μm; adhesive strength=27.8 N/25 mm; manufactured by Lintec Corporation) having transparent adhesive thin layer (III) on one surface and a hard coating layer on the other surface, was pasted on the glass substrate obtained in (4), with care to eliminate air bubbles, using an autoclave (70° C., 0.6 MPa, 30 minutes).

(6) Evaluation of ITO Pattern Visibility

The ITO pattern visibility from the back surface side of the glass substrate obtained in (5) was evaluated in the following 10 grades. Those evaluated as grade 6 or above were defined as "pass".

10: The pattern is totally invisible by gazing at 5 cm under a white fluorescent lamp.

9: The pattern is slightly visible by gazing at 5 cm under a white fluorescent lamp.

8: The pattern is a little visible by gazing at 5 cm under a white fluorescent lamp.

7: The pattern is clearly visible by gazing at 5 cm under a white fluorescent lamp.

6: The pattern is slightly visible by regular visual observation at 5 cm under a white fluorescent lamp.

5: The pattern is a little visible by regular visual observation at 5 cm under a white fluorescent lamp.
4: The pattern is clearly visible by regular visual observation at 5 cm under a white fluorescent lamp.
3: The pattern is slightly visible by regular visual observation under a room light.
2: The pattern is a little visible by regular visual observation under a room light.
1: The pattern is clearly visible by regular visual observation under a room light.

(7) Evaluation of Adhesive Strength of Transparent Adhesive Thin Layer (III)

On the film pasted to the substrate in (5), a cut was made in a size of 2.5 cm width and 5 cm length using a utility knife, and the adhesive strength of the transparent adhesive thin layer (III) was tested, using a tensile test apparatus in accordance with JIS Z0237 (2000). The adhesive strength was evaluated according to the following standards.

3: Peeling occurred at the interface between organic thin layer (II) and transparent adhesive thin layer (III), when a tensile force of greater than 25 N/25 mm was applied to the film.
2: Peeling occurred at the interface between organic thin layer (II) and transparent adhesive thin layer (III), when a tensile force of greater than 15 [N/25 mm] and not more than 25 [N/25 mm] was applied to the film.
1: Peeling occurred at the interface between organic thin layer (II) and transparent adhesive thin layer (III), or at the interface between ITO thin layer (I) and organic thin layer (II), when a tensile force of not more than 15 N/25 mm was applied to the film.

Examples 2 to 18 and Examples 28 to 37

Substrates were prepared and evaluated in the same manner as described in Example 1, based on the constitutions shown in Table 2. It should be noted, however, that in the step of forming organic thin layer (II) in Examples 9 and 10 and in Examples 12 to 16, aqueous 2.38 wt % TMAH solution was used as a developer.

Examples 19 to 25

Substrates were prepared and evaluated in the same manner as described in Example 1 except that the constitutions shown in Table 2 were used, and that each organic thin layer (II) was formed according to the following procedure.

A piece of cellophane tape was pasted in advance, on a region where organic thin layer (II) is not formed, at the edge of the each of the glass substrates obtained in (3), respectively. Each of the resin compositions (H19) to (H25) obtained in Preparation Examples 19 to 25 was then spin coated on each of the glass substrates, respectively, followed by prebaking at 90° C. for 2 minutes using a hot plate. Then each piece of cellophane tape was peeled off. Each of the resulting substrates was then cured in air at 230° C. for 1 hour to form a cured layer (reference numeral 5 in FIG. 2) having a film thickness of 0.10 μm, which corresponds to organic thin layer (II).

Examples 26 and 27

(1) Preparation of ITO Pattern

On 0.2 mm-thick PET substrates, ITO patterns were prepared in the same manner as described in Example 1. It should be noted, however, that a bar coater was used for coating the photoresist, an oven was used for prebaking, and aqueous 5 wt % oxalic acid solution was used as an etchant (2) Formation of Organic Thin Layer (II)

Each of the PET substrates obtained in (1) was coated with the resin composition (H2) or (H7) obtained in Preparation Example 2 or 7, using a bar coater, in order to achieve the constitution shown in Table 2, followed by prebaking at 90° C. for 10 minutes in an oven. Each of the obtained prebaked layers was exposed to 2000 J/m$^2$ of light through a mask, with a 100 μm gap. Then shower development was performed with aqueous 0.4 wt % TMAH solution for 90 seconds, followed by rinsing with water for 30 seconds. Each of the resulting substrates was then cured in air at 130° C. for 1 hour to form a cured layer having a film thickness of 0.10 μm, which corresponds to organic thin layer (II).

(3) Pasting of Film Having Transparent Adhesive

A PET film having an adhesive on one surface and a hard coat on the other surface (HA-116; manufactured by Lintec Corporation) was pasted, respectively, on one region of the each of the PET substrates obtained in (2), with care to eliminate air bubbles, using an autoclave (70° C., 0.6 MPa, 30 minutes).

(4) Evaluation of ITO Pattern Visibility

The pattern visibility from the back surface side of the PET substrates obtained in (3) was evaluated in the same manner as described in Example 1.

Examples 38 and 39

Substrates were prepared and evaluated in the same manner as described in Example 2 except that, in the step of pasting a film having transparent adhesive thin layer (III) in (5), "HA-110" (refractive index of the adhesive=1.50, the film thickness of transparent adhesive thin layer (III)=30 μm; manufactured by Lintec Corporation) was used instead of "HA-116".

Comparative Example 1

A substrate was prepared and evaluated in the same manner as described in Example 1, except that the step of forming organic thin layer (II) was not performed.

Comparative Examples 2 to 4

Substrates were prepared and evaluated in the same manner as described in Example 1, based on constitutions shown in Table 2. It should be noted, however, that in the step of forming organic thin layer (II) in Comparative Examples 3 and 4, aqueous 2.38 wt % TMAH solution was used as a developer.

DESCRIPTION OF SYMBOLS

1: Transparent ground substrate
2: ITO thin layer (I)
3: Insulating layer
4: MAM wiring
5: Organic thin layer (II)
6: Transparent adhesive thin layer (III)
7: Sufficiently large area of the substrate onto which ITO thin layer (I), organic thin layer (II), and transparent adhesive thin layer (III) are laminated The substrate of the present invention can be used in a resistive type touch panel, capacitive type touch panel, a TFT substrate or the like.

The invention claimed is:

1. A substrate comprising a region where thin layers are laminated on a transparent ground substrate, in which the thin layers are directly in contact in the order mentioned from the upper surface of the substrate, an ITO thin layer (I), an organic thin layer (II) having a film thickness of from 0.01 to 0.4 um and a refractive index of from 1.58 to 1.85; and a transparent adhesive thin layer (III) having a refractive index of from 1.46 to 1.52, wherein said organic thin layer (II) contains a resin selected from the group consisting of polyimides, cardo type resins, acrylic resins, polysiloxanes, polybenzoxazoles, phenol resins, polyamideimides, polyethersulfones, polyurethanes and polyesters; wherein said organic thin layer (ii) contains metal oxide particles.

2. The substrate according to claim 1, wherein said organic thin layer (II) contains a resin selected from the group consisting of polyimides, cardo type resins, polysiloxanes, polybenzoxazoles, phenol resins, polyamideimides, polyethersulfones and polyesters.

3. The substrate according to claim 1, wherein said organic thin layer (II) contains a resin containing a carboxyl group and/or a phenolic hydroxyl group.

4. The substrate according to claim 1, wherein said organic thin layer (II) is formed using a resin composition containing a precursor selected from the group consisting of polyimide precursors, polyamideimide precursors and polybenzoxazole precursors.

5. The substrate according to claim 1, wherein said transparent ground substrate is a tempered glass substrate.

6. A touch panel member using the substrate according to claim 1.

* * * * *